(12) United States Patent
Cheng et al.

(10) Patent No.: US 10,269,660 B2
(45) Date of Patent: Apr. 23, 2019

(54) METROLOGY SAMPLING METHOD WITH SAMPLING RATE DECISION SCHEME AND COMPUTER PROGRAM PRODUCT THEREOF

(71) Applicant: NATIONAL CHENG KUNG UNIVERSITY, Tainan (TW)

(72) Inventors: Fan-Tien Cheng, Tainan (TW); Chun-Fang Chen, Hsinchu County (TW); Jhao-Rong Lyu, Changhua County (TW); Yao-Sheng Hsieh, Tainan (TW)

(73) Assignee: NATIONAL CHENG KUNG UNIVERSITY, Tainan (TW)

( * ) Notice: Subject to any disclaimer, the term of this patent is extended or adjusted under 35 U.S.C. 154(b) by 324 days.

(21) Appl. No.: 15/158,604

(22) Filed: May 19, 2016

(65) Prior Publication Data

US 2016/0349736 A1  Dec. 1, 2016

(30) Foreign Application Priority Data

May 27, 2015 (TW) .............................. 104117016 A

(51) Int. Cl.
*G05B 13/04* (2006.01)
*H01L 21/66* (2006.01)
*G05B 19/418* (2006.01)

(52) U.S. Cl.
CPC ........ *H01L 22/20* (2013.01); *G05B 19/41875* (2013.01); *G05B 13/048* (2013.01); (Continued)

(58) Field of Classification Search
CPC .............. H01L 22/20; G05B 19/41875; G05B 13/048; G05B 2219/45031; G05B 2219/32187; Y02P 90/12; Y02P 90/02
See application file for complete search history.

(56) References Cited

U.S. PATENT DOCUMENTS 7,243,327 B1   7/2007  Tain et al.
7,437,199 B2  10/2008  Willis et al.
(Continued)

FOREIGN PATENT DOCUMENTS

JP  H05135068 A  6/1993
JP  H11129145 A  5/1999
(Continued)

OTHER PUBLICATIONS

Kang, Pilsung & Kim, Dongil & Lee, Hyoungjoo & Doh, Seungyong & Cho, Sungzoon. (2011). Virtual metrology for run-to-run control in semiconductor manufacturing. Expert Syst. Appl.. 38. 2508-2522. 10.1016/j.eswa.2010.08.040.*

(Continued)

*Primary Examiner* — Charles D Garber
*Assistant Examiner* — Alia Sabur
(74) *Attorney, Agent, or Firm* — CKC & Partners Co., LLC

(57) ABSTRACT

In a metrology sampling method with a sampling rate decision scheme, a mean absolute percentage error (MAPE) and a maximum absolute percentage error (MaxErr) of visual metrology values of all workpieces in a set of determinative samples (DS), and various index values that can detect various status changes of a process tool (such as maintenance operation, parts changing, parameter adjustment, etc.), and/or information abnormalities of the process tool (such as abnormal process data, parameter drift/shift, abnormal metrology data, etc.) appearing in a manufacturing process are applied to develop an automated sampling decision (ASD) scheme for reducing a workpiece sampling rate while VM accuracy is still sustained.

20 Claims, 10 Drawing Sheets

(52) U.S. Cl.
CPC .......... *G05B 2219/32187* (2013.01); *G05B 2219/45031* (2013.01); *Y02P 90/02* (2015.11); *Y02P 90/12* (2015.11)

(56) References Cited

U.S. PATENT DOCUMENTS

| | | | |
|---|---|---|---|
| 7,493,185 | B2 | 2/2009 | Cheng et al. |
| 7,593,912 | B2 | 9/2009 | Cheng et al. |
| 7,603,328 | B2 | 10/2009 | Cheng et al. |
| 8,095,484 | B2 | 1/2012 | Cheng et al. |
| 8,688,256 | B2 | 4/2014 | Cheng et al. |
| 8,862,525 | B2 | 10/2014 | Cheng et al. |
| 8,983,644 | B2 | 3/2015 | Cheng et al. |
| 2004/0243256 | A1 | 12/2004 | Willis et al. |
| 2005/0288812 | A1 | 12/2005 | Cheng et al. |
| 2009/0292386 | A1 | 11/2009 | Cheng et al. |
| 2010/0249974 | A1* | 9/2010 | Fei .................. G05B 21/02 700/105 |
| 2010/0312374 | A1* | 12/2010 | Tsai ................ G01R 31/2894 700/110 |
| 2011/0190917 | A1 | 8/2011 | Moyne |
| 2013/0011939 | A1* | 1/2013 | Chan ............. G05B 19/41865 438/14 |
| 2014/0031968 | A1 | 1/2014 | Baseman et al. |

FOREIGN PATENT DOCUMENTS

| | | |
|---|---|---|
| JP | 2007213147 A | 8/2007 |
| TW | I222696 B | 10/2004 |
| TW | I407325 | 9/2013 |
| TW | I427487 B | 2/2014 |
| TW | I463334 B | 12/2014 |
| TW | I481978 B | 4/2015 |
| TW | I521360 | 2/2016 |

OTHER PUBLICATIONS

Alan Weber, "Virtual Metrology and Your Technology Watch List: Ten Things You Should Know about This Emerging Technology," Future Fab International, Issue 22, Section 4, 2007, pp. 52-54.

Fan-Tien Cheng et al., "Dual-Phase Virtual Metrology Scheme," IEEE Transactions on Semiconductor Manufacturing, vol. 20, No. 4, Nov. 2007, pp. 566-571.

Fan-Tien Cheng et al., "Developing an Automatic Virtual Metrology System," IEEE Transactions on Automation Science and Engineering, vol. 9, No. 1, Jan. 2012, pp. 181-188.

Fan-Tien Cheng et al., "Tutorial on Applying the VM Technology for TFT-LCD Manufacturing," IEEE Transactions on Semiconductor Manufacturing, vol. 28, No. 1, Feb. 2015, pp. 55-69.

Andre Holfeld et al., "A Fab-Wide APC Sampling Application," IEEE Transactions on Semiconductor Manufacturing, vol. 20, No. 4, Nov. 2007, pp. 393-399.

Jang Hee Lee, "Artificial Intelligence-Based Sampling Planning System for Dynamic Manufacturing Process," Expert Systems with Applications, vol. 22, 2002, pp. 117-133.

Justin Nduhura-Munga et al., "Dynamic Management of Controls in Semiconductor Manufacturing," Proceedings of IEEE/SEMI Advanced Semiconductor Manufacturing Conference, Saratoga Springs, 2011 IEEE, 6 pages.

Justin Nduhura-Munga et al., "A Literature Review on Sampling Techniques in Semiconductor Manufacturing," IEEE Transactions on Semiconductor Manufacturing, vol. 26, No. 2, May 2013, pp. 188-195.

Ali Bousetta et al., "Adaptive Sampling Methodology for In-Line Defect Inspection." 2005 IEEE/SEMI Advanced Semiconductor Manufacturing Conference, 7 pages.

Daniel Kurz et al., "A Sampling Decision System for Virtual Metrology in Semiconductor Manufacturing," IEEE Transactions on Automation Science and Engineering, vol. 12, No. 1, Jan. 2015, pp. 75-83.

Fan-Tien Cheng et al., "Intelligent Sampling Decision Scheme Based on the AVM System," International Journal of Production Research, 2015, vol. 53, No. 7, pp. 2073-2088, published online: Sep. 10, 2014.

Fan-Tien Cheng et al., "Evaluating Reliance Level of a Virtual Metrology System," IEEE Transactions on Semiconductor Manufacturing, vol. 21, No. 1, Feb. 2008, pp. 92-103.

Yi-Ting Huang et al., "Automatic Data Quality Evaluation for the AVM System," IEEE Transactions on Semiconductor Manufacturing, vol. 24, No. 3, Aug. 2011, pp. 445-454.

Yao-Sheng Hsieh et al., "Dynamic ISD Scheme for the AVM System—a Preliminary Study," 2015 IEEE International Conference on Robotics and Automation (ICRA 2015), Seattle, Washington, May 26-30, 2015.

Matthew Taylor, "What is sensitivity analysis?" Health economics, 2009.

* cited by examiner

METROLOGY SAMPLING METHOD WITH SAMPLING RATE DECISION SCHEME AND COMPUTER PROGRAM PRODUCT THEREOF

RELATED APPLICATIONS

This application claims priority to Taiwan Application Serial Number 104117016, filed May 27, 2015, which is herein incorporated by reference.

BACKGROUND

Field of Invention

The present invention relates to a metrology sampling method with a sampling rate decision scheme. More particularly, the present invention relates to a metrology sampling method for reducing and automatically adjusting a workpiece sampling rate.

Description of Related Art

Nowadays, most of the semiconductor and TFT-LCD plants adopt sampling test methods to monitor the quality of each product or workpiece (i.e. "wafer" in IC foundries or "glass" in TFT-LCD factories) processed by process tools. In general, after each N (for example, 25) workpieces are processed by the process tool, a manufacturing system designates the $N^{th}$ workpiece in the each N workpieces as a workpiece expected (scheduled) to be measured, i.e. the sampling rate is fixed as 1/N. The workpiece expected to be measured then will be sent to a metrology tool for measurement, thereby inspecting the production quality of the process tool. This conventional sampling method is based on the presupposition that no abnormal circumstances will abruptly occur in the production processes, and thus the measurement result of the sampled product or workpiece can be used to determine the quality of the workpieces in the same lot with the sampled workpiece. Because the measurement time and tool required by the real workpiece metrology result in the increase of cycle time and production cost. Therefore, reducing the sampling rate to as low as possible is an important task for manufactures for reducing cycle time and production cost. Besides, the value of the conventional workpiece sampling rate 1/N is selected merely in accordance with an experience value of the manufacturing system without other technical bases, and thus cannot be effectively adjusted.

On the other hand, virtual metrology (VM) can be used to lower the frequency of actual measurement on workpiece to reduce the sampling rate. However, if a production variation occurs on the workpiece which is unplanned for measurement, no real metrology is available during this period for updating the VM models, thus resulting in poor VM prediction accuracy. Therefore, how to sample and obtain an appropriate workpiece in time affects the prediction accuracy of VM models.

Hence, there is a need to provide a metrology sampling method for overcoming the aforementioned shortcomings of the conventional skill.

SUMMARY

An object of the present invention is to provide a metrology sampling method for automatically adjusting and reducing a metrology sampling for workpieces.

Another object of the present invention is to provide a metrology sampling method for providing an actual measurement value of a workpiece in time to retune or retrain a VM model, thereby assuring VM accuracy.

According to the aforementioned objects, a metrology sampling method is provided. In the metrology sampling method, a plurality of sets of historical process data used by a process tool for processing a plurality of historical workpieces, and a plurality of historical measurement values of the historical workpieces corresponding to the sets of historical process data are collected. Then, a model-creation step is performed and includes: building a conjecture model in accordance with a conjecture algorithm by using the sets of historical process data and the historical measurement values. Thereafter, a workpiece sampling rate represented by 1/N is initialized, in which the workpiece sampling rate is directed to selecting the Nth workpiece in each N workpieces processed by a process tool as a workpiece expected to be measured. Then, a workpiece is added to a set of determinative samples. Then, a set of process data which is used by the process tool to process the workpiece, and an actual measurement of the workpiece corresponding to the set of process data are collected. Thereafter, the set of process data of the workpiece is inputted into the conjecture model, thereby computing a virtual metrology value of the workpiece. Then, an absolute percentage error of the virtual metrology value of the workpiece is computed, and a step is performed to determine if the absolute percentage error of the virtual metrology value is greater than a specification of virtual metrology maximum error defined for the process tool, thereby obtaining a first result. When the first result is true, an OOS (Out of Spec) count is increased by 1. When the first result is false, a mean absolute percentage error (MAPE) of virtual metrology values of all workpieces in the set of determinative samples is computed, and a step is performed to determine if the mean absolute percentage error is greater than or equal to an upper control limit of MAPE, thereby obtaining a second result. When the second result is true, the workpiece sampling rate is increased by decreasing N, the set of determinative samples is cleared, and the OOS count is set to 0. When the second result is false, a step is performed to determine if the number of workpieces in the set of determinative samples is greater than or equal to a threshold of the number of determinative samples, thereby obtaining a third result.

When the third result is false, the workpiece sampling rate is retained unchanged. When the third result is true, a maximum absolute percentage error (MaxErr) of virtual metrology values of all workpieces in the set of determinative samples is computed, and a step is performed to determine if the maximum absolute percentage error is smaller than an upper control limit of MaxErr, thereby obtaining a fourth result. When the fourth result is true, the workpiece sampling rate is decreased by increasing N, the set of determinative samples is cleared, and the OOS count is set to 0. When the fourth result is false, an oldest workpiece in the set of determinative samples is discarded, and the workpiece sampling rate is retained unchanged.

According to an embodiment of the present invention, when the first result is true, a step is performed to determine if the OOS count is greater than or equal to a OOS threshold, thereby obtaining a fifth result. When the fifth result is true, the workpiece sampling rate is increased by decreasing N, the set of determinative samples is cleared, and the OOS count is set to 0.

According to an embodiment of the present invention, a minimum workpiece sampling rate represented by $1/N_{max}$ and a default workpiece sampling rate represented by $1/N_{default}$ are obtained, in which $N_{max}$ is a maximum value of N, and $N_{default}$ is a default value of N. Then, a third conservative factor is multiplied by $N_{max}$, thereby obtaining a test value. A step is performed to determine if the test value is greater than $N_{default}$, thereby obtaining a sixth result. When the sixth result is true, $N_{default}$ is set equal to the test value.

According to an embodiment of the present invention, a first checking step is performed to check if a status change of the process tool occurs, thereby obtaining a first checking result. When the first checking result is true, the set of determinative samples is cleared, and the OOS count is set to 0. A second checking step is performed to check if N is greater than $N_{default}$, thereby obtaining a second checking result. When the second checking result is true, N is set to $N_{default}$.

According to an embodiment of the present invention, in the aforementioned metrology sampling method, the model-creation step is further performed to build a $DQI_x$ (Process Data Quality Index) model and a GSI (Global Similarity Index) model and computing a $DQI_x$ threshold and a GSI threshold by using the sets of historical process data. Then, a metrology workpiece sampling step is performed. In the metrology workpiece sampling step, the set of process data of the workpiece is inputted into the $DQI_x$ model and the GSI model, thereby obtaining a $DQI_x$ value and a GSI value of the set of process data of the workpiece. Thereafter, a workpiece count is increased by 1. When the first checking result is true, a third checking step is performed to check if the $DQI_x$ value is smaller than or equal to the $DQI_x$ threshold, thereby obtaining a third checking result. When the third checking result is false, a measurement of the workpiece is skipped. When the third checking result is true, a fourth checking step is performed to check if the workpiece count is greater than or equal to N, thereby obtaining a fourth checking result. When the fourth checking result is true, metrology is performed on the workpiece and the workpiece count is set to 0. When the fourth checking result is false, a fifth checking step is performed to check if the GSI value of the workpiece is smaller than or equal to the GSI threshold, thereby obtaining a fifth checking result. When the fifth checking result is true, the measurement of the workpiece is skipped.

According to an embodiment of the present invention, in the metrology sampling method, a reference model is built in accordance with a reference prediction algorithm by using the sets of historical process data and the historical measurement values, in which the conjecture algorithm is different from the reference prediction algorithm. A RI (Reliance Index) threshold is computed based on a maximal tolerable error limit defined by errors of virtual metrology values obtained from the conjecture model. The set of process data of the workpiece is inputted into the reference model, thereby computing a reference prediction value of the workpiece. An overlap area between the statistical distribution of the virtual metrology value of the workpiece and the statistical distribution of the reference prediction value of the workpiece is calculated, thereby generating a RI value of the workpiece. When the fourth checking result is false, a sixth checking step is performed to check if the RI value of the workpiece is greater than or equal to the RI threshold, thereby obtaining a sixth checking result. When the sixth checking result is true, the measurement of the workpiece is skipped.

According to an embodiment of the present invention, metrology is performed on the workpiece and setting the workpiece count to 0, when the fifth checking result or the sixth checking result is false, and the GSI values of k workpieces processed before the workpiece all are greater than the GSI threshold or the RI values of k workpieces processed before the workpiece all are smaller than the RI threshold, in which k is a positive integer.

According to the aforementioned objects, a computer program product stored on a non-transitory tangible computer readable recording medium is provided. When the computer program product is loaded by a computer and executed, the aforementioned metrology sampling methods are performed.

Thus, with the application of the embodiments of the present invention, the workpiece sampling rate can be automatically adjusted and greatly lowered, and the VM accuracy can be effectively assured.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
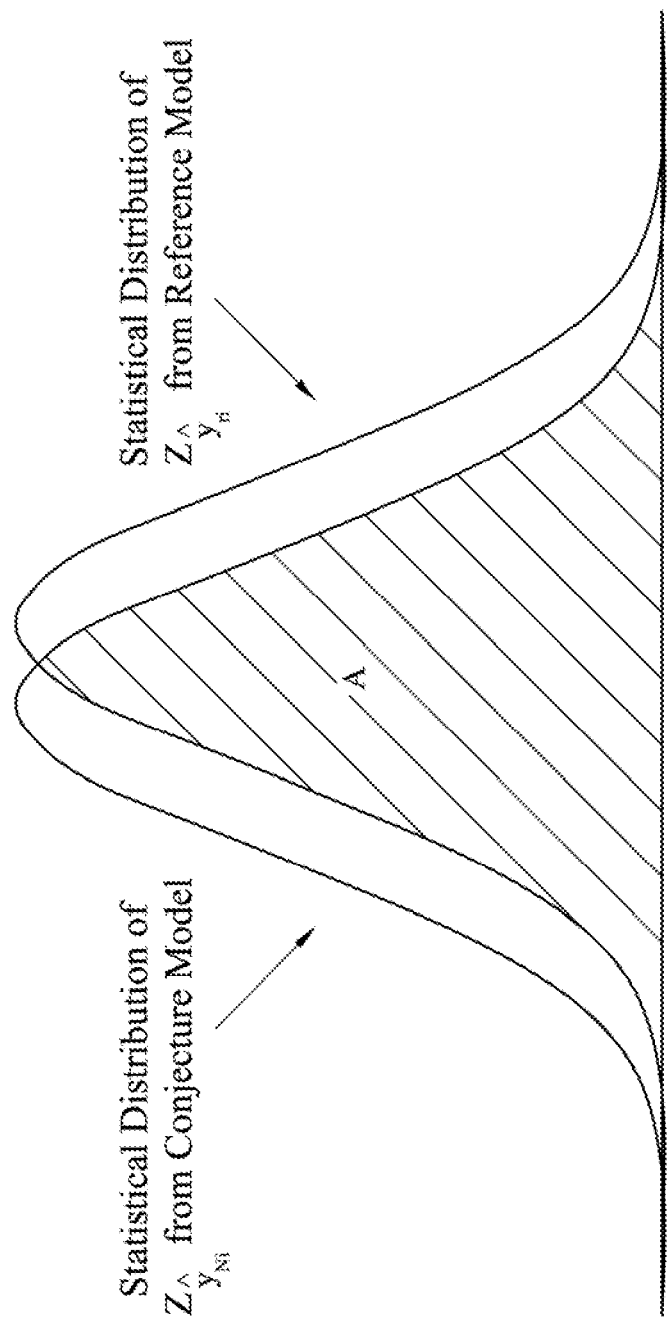
FIG. 1 is a schematic diagram for explaining a reliance index (RI) according to some embodiments of the present invention.

Reference will now be made in detail to the present embodiments of the invention, examples of which are illustrated in the accompanying drawings. Wherever possible, the same reference numbers are used in the drawings and the description to refer to the same or like parts.

Embodiments of the present invention are directed a metrology sampling method applying a mean absolute percentage error (MAPE) and a maximum absolute percentage error (MaxErr) of visual metrology values of all workpieces in a set of determinative samples (DS) to adjust a workpiece sampling rate. The metrology sampling method also combine various index values that can detect various status changes of a process tool (such as maintenance operation, parts changing, parameter adjustment, etc.), and/or information abnormalities of the process tool (such as abnormal process data, parameter drift/shift, abnormal metrology data, etc.) appearing in a manufacturing process are applied to develop an automated sampling decision (ASD) scheme for reducing sampling rate while VM accuracy is still sustained.

The indices includes a reliance Index (RI), a global similarity index (GSI), a process data quality index ($DQI_x$) and a metrology data quality index ($DQI_y$). The RI value, the GSI value, the $DQI_x$ value and the $DQI_y$ value used in the embodiments of the present invention can be referenced to U.S. Pat. No. 8,095,484 B2. Embodiments of the present invention can be combined with the VM system disclosed by U.S. Pat. No. 8,095,484 B2. U.S. Pat. No. 8,095,484 B2 is hereby incorporated by reference. The RI value is designed to gauge the reliance level of a virtual metrology value. The GSI value is used to assess the degree of similarity between the current set of input process data and all of the sets of process data used for building and training a conjecture model. The GSI value is provided to help the RI value gauge the reliance level of VM system. The $DQI_x$ value is used to evaluate whether a set of process data used for producing a workpiece is abnormal, and the $DQI_y$ value is used to evaluate whether the metrology data of the workpiece are abnormal.

Hereinafter, theoretical bases related to the RI value (RI model), the GSI value (GSI model), the $DQI_x$ value ($DQI_x$ model) and the $DQI_y$ value ($DQI_y$ model) are first explained.

The RI and GSI are used to learn in real time whether the VM value is reliable. The RI model is used to compute a RI value between 0 and 1 by analyzing the process data of the process tool, thereby determining whether the virtual metrology result can be trusted. The GSI model is used to compute the GSI value for the process. The GSI value is defined as the degree of similarity between the current set of input process data and all of the sets of the process data used for building or training the models.

Referring to Table 1, n sets of historical data are assumed to be collected, including process data ($X_i$, i=1, 2 . . . , n) and the corresponding actual measurement values ($y_i$, i=1, 2, . . . , n), where each set of process data contains p individual parameters (from parameter 1 to parameter p), namely $X_i=[x_{i,1}, x_{i,2}, \ldots, x_{i,p}]^T$. Additionally, (m−n) sets of process data in actual production were also collected, but no actual measurement values are available besides $y_{n+1}$. That is, only the first among (m−n) pieces of the products is selected and actually measured. In the current manufacturing practice, the actual measurement value $y_{n+1}$ obtained is used to infer and evaluate the quality of the (m−n−1) pieces of the products.

TABLE 1

| Sample Data Set | Parameter 1 | Parameter 2 | ... | Parameter p | Actual Measurement Value |
|---|---|---|---|---|---|
| 1 | $x_{1,1}$ | $x_{1,2}$ | ... | $x_{1,p}$ | $y_1$ |
| 2 | $x_{2,1}$ | $x_{2,2}$ | ... | $x_{2,p}$ | $y_2$ |
| ... | ... | ... | ... ... | ... |
| n | $x_{n,1}$ | $x_{n,2}$ | ... | $x_{n,p}$ | $y_n$ |
| n + 1 | $x_{n+1,1}$ | $x_{n+1,2}$ | ... | $x_{n+1,p}$ | $y_{n+1}$ |
| n + 2 | $x_{n+2,1}$ | $x_{n+2,2}$ | ... | $x_{n+2,p}$ | Zip |
| ... | ... | ... | ... ... | ... |
| m | $x_{m,1}$ | $x_{m,2}$ | ... | $x_{m,p}$ | Zip |

As shown in Table 1, $y_1, y_2, \ldots, y_n$ are historical measurement values, and $y_{n+1}$ is the actual measurement value of the first piece of the products being manufactured. Generally, a set of actual measurement values ($y_i$, i=1, 2, . . . , n) is a normal distribution with mean μ and standard deviation σ, namely $y_i \sim N(\mu, \sigma^2)$.

All the actual measurement values can be standardized in terms of the mean and standard deviation of the sample set ($y_i$, i=1, 2, . . . , n). Their standardized values (also called z scores) $Z_{y_1}, Z_{y_2}, \ldots, Z_{y_n}$ are thus derived, where each z score has mean zero and standard deviation one, namely $Z_{y_i} \sim N(0,$ 1). Regarding the actual measurement data, a corresponding $Z_{y_i}$ close to 0 indicates that the actual measurement value approaches the central value of the specification. The equations for standardization are listed as follows:

$$Z_{y_i} = \frac{y_i - \bar{y}}{\sigma_y}, i = 1, 2, \ldots, n \quad (1)$$

$$\bar{y} = \frac{1}{n}(y_1 + y_2 + \ldots + y_n) \quad (2)$$

$$\sigma_y = \sqrt{\frac{1}{n-1}[(y_1 - \bar{y})^2 + (y_2 - \bar{y})^2 + \ldots + (y_n - \bar{y})^2]} \quad (3)$$

wherein $y_i$ is the i-th actual measurement value,
$Z_{y_i}$ is the standardized i-th actual measurement value,
$\bar{y}$ is the mean of all the actual measurement values, and
$\sigma_y$ is the standard deviation of all the actual measurement values.

The explanation herein adopts a neural-network (NN) algorithm as the conjecture algorithm for establishing the conjecture model performing virtual measurement, and uses such as a multi-regression (MR) algorithm to be the reference algorithm for establishing the reference model that serves as a comparison base for the conjecture model. However, the present invention can also apply other algorithms to be the conjecture algorithm or the reference algorithm, such as a back propagation neural network (BPNN) algorithm, a general regression neural network (GRNN) algorithm, a radial basis function neural network (RBFNN) algorithm, a simple recurrent network (SRN) algorithm, a support vector data description (SVDD) algorithm, a support vector machine (SVM) algorithm, a multiple regression (MR) algorithm, a partial least squares (PLS) algorithm, a nonlinear iterative partial least squares (NIPALS) algorithm or generalized linear models (GLMs), provided the reference algorithm differs from the conjecture algorithm, such as a SVM algorithm and other related algorithms, and thus the present invention is not limited thereto.

When the NN and MR algorithms are utilized, if their convergence conditions both are that SSE (Sum of Square Error) is minimized with n→∞, their standardized predictive measurement values (defined as $Z_{y_{N_i}}$ and $Z_{y_{r_i}}$ respectively) should be the same as the standardized actual measurement value $Z_{y_i}$. Restated, when n→∞, $Z_{y_i}=Z_{y_{N_i}}=Z_{y_{r_i}}$ all represent the standardized actual measurement value, but they have different names due to having different purposes and different estimating models. Hence, $$Z_{y_{N_i}} \sim N(\mu_{Z_{y_i}}, \sigma_{Z_y}^2)$$

and $$Z_{y_{r_i}} \sim N(\mu_{Z_{y_i}}, \sigma_{Z_y}^2)$$

indicate that $Z_{y_{N_i}}$ and $Z_{y_{r_i}}$ share the same statistical distribution. However, owing to the existence of different estimating models, the estimations of mean and standard deviation differ between those two prediction algorithms. Namely the standardized mean-estimating equation $$(\hat{\mu}_{Z_{y_i}} = Z_{y_{N_i}})$$

and standard-deviation-estimating equation $$(\hat{\sigma}_{Z_y} = \hat{\sigma}_{Z_{\hat{y}_N}})$$

with respect to the NN conjecture model differ from the standardized mean-estimating equation $$(\hat{\mu}_{Z_{y_i}} = Z_{\hat{y}_{r_i}})$$

and standard-deviation-estimating equation $$(\hat{\sigma}_{Z_y} = \hat{\sigma}_{Z_{\hat{y}_r}})$$

with respect to the MR reference model.

The RI is designed to gauge the reliance level of the virtual metrology value. The RI thus should consider the degree of similarity between the statistical distribution $Z_{\hat{y}_{N_i}}$ of the virtual metrology value and the statistical distribution $Z_{y_i}$ of the actual measurement value. However, when virtual metrology is applied, no actual measurement value can be used to verify the trustworthiness of the virtual metrology value. (Notably, virtual metrology becomes unnecessary if actual measurement values are obtained.) Instead, the present invention adopts the statistical distribution $Z_{\hat{y}_{r_i}}$ estimated by the reference algorithm which is such as the MR algorithm to replace $Z_{y_i}$. The reference algorithm also can be such as a time-series algorithm and other related algorithms, and thus the present invention is not limited thereto.

Referring to FIG. 1, FIG. 1 is a schematic diagram for explaining the reliance index (RI) according to the preferred embodiment of the present invention. The RI of the present invention is defined as the intersection-area value (overlap area A) between the statistical distribution $Z_{\hat{y}_{N_i}}$ of the virtual metrology value from the conjecture model (built by such as the NN algorithm) and the statistical distribution $Z_{\hat{y}_{r_i}}$ of the reference prediction value from the reference model (built by such as the MR algorithm). As such, the RI equation is listed below:

$$RI = 2 \int_{\frac{Z_{\hat{y}_{N_i}} + Z_{\hat{y}_{r_i}}}{2}}^{\infty} \frac{1}{\sqrt{2\pi}\,\sigma} e^{-\frac{1}{2}\left(\frac{x-\mu}{\sigma}\right)^2} dx \quad (4)$$

with $$\mu = Z_{\hat{y}_{N_i}} \text{ if } Z_{\hat{y}_{N_i}} < Z_{\hat{y}_{r_i}}$$

$$\mu = Z_{\hat{y}_{r_i}} \text{ if } Z_{\hat{y}_{r_i}} < Z_{\hat{y}_{N_i}}$$

and $\sigma$ is set to be 1.

The RI increases with increasing overlap area A. This phenomenon indicates that the result obtained using the conjecture model is closer to that obtained from the reference model, and thus the corresponding virtual metrology value is more reliable. Otherwise, the reliability of the corresponding measurement value reduces with decreasing RI. When the distribution $Z_{\hat{y}_{N_i}}$ estimated from $Z_{y_{N_i}}$ is fully overlapped with the distribution $Z_{\hat{y}_{r_i}}$ estimated from $Z_{y_{r_i}}$, then according to the distribution theory of statistics, the RI value equals 1; and, when those two distributions are almost separate, the RI value approaches 0.

Hereinafter, the method for calculating the statistical distribution of the virtual metrology values ($Z_{\hat{y}_{N_i}}$ and $\hat{\sigma}_{Z_{\hat{y}_N}}$) from the conjecture model is explained.

In the NN conjecture model, if the convergence condition is to minimize SSE, then it can be assumed that "for given $Z_{x_{i,j}}$, $Z_{y_{N_i}}$ is the distribution with mean $\mu_{Z_{y_i}}$ and standard deviation $\sigma_{Z_y}$", namely for given $Z_{x_{i,j}}$, $$Z_{y_{N_i}} \sim N(\mu_{Z_{y_i}}, \sigma^2_{Z_y}),$$

where the NN estimating equation of $\mu_{Z_{y_i}}$ is $\hat{\mu}_{Z_{y_i}} = Z_{\hat{y}_{N_i}}$ and the NN estimating equation of $$\sigma^2_{Z_y} \text{ is } \hat{\sigma}^2_{Z_y} = \hat{\sigma}^2_{Z_{\hat{y}_N}}$$

Before the NN conjecture model is constructed, the process data must be standardized. The equations for standardizing the process data are presented below:

$$Z_{x_{i,j}} = \frac{x_{i,j} - \bar{x}_j}{\sigma_{x_j}},\ i = 1, 2, \ldots, n, n+1, \ldots, m; \quad (5)$$

$$j = 1, 2, \ldots, p$$

$$\bar{x}_j = \frac{1}{n}(x_{1,j} + x_{2,j} + \ldots + x_{n,j}) \quad (6)$$

$$\sigma_{x_j} = \sqrt{\frac{1}{n-1}[(x_{1,j} - \bar{x}_j)^2 + (x_{2,j} - \bar{x}_j)^2 + \ldots + (x_{n,j} - \bar{x}_j)^2]} \quad (7)$$

wherein $x_{i,j}$ is the j-th process parameter in the i-th set of process data, $Z_{x_{i,j}}$ is the standardized j-th process parameter in the i-th set of process data;

$\bar{x}_j$ is the mean of the j-th process data;

$\sigma_{x_j}$ is the standard deviation of the j-th process data.

The n sets of standardized process data ($Z_{x_{i,j}}$, i=1, 2, ..., n; j=1, 2, ..., p) and the n standardized actual measurement values ($Z_{y_i}$, i=1, 2, ..., n) are utilized to build the NN conjecture model. The m sets of standardized process data ($Z_{x_{i,j}}$, i=1, 2, ..., m; j=1, 2, ..., p) are then inputted into the NN conjecture model to obtain the corresponding standardized virtual metrology values:

$$Z_{\hat{y}_{N_1}},$$

$$Z_{\hat{y}_{N_2}}, \ldots, Z_{\hat{y}_{N_n}},$$

$$Z_{\hat{y}_{N_{n+1}}}, \ldots, Z_{\hat{y}_{N_m}}.$$

Accordingly, the estimated value of $$\mu_{Z_{y_i}}\ (\text{i.e. } \hat{\mu}_{Z_{y_i}} = Z_{\hat{y}_{N_i}})$$

and the estimated value of $\sigma_{Z_y}$ (i.e. $\hat{\sigma}_{Z_y}=\hat{\sigma}_{Z_{\hat{y}N}}$) can be computed as follows:

$$\hat{\mu}_{Z_{yi}} = Z_{\hat{y}_{Ni}}, i = 1, 2, \ldots, n, n+1, \ldots, m \quad (8)$$

$$\hat{\sigma}_{Z_{\hat{y}N}} = \sqrt{\frac{1}{n-1}\left[(Z_{\hat{y}_{N1}} - \overline{Z}_{\hat{y}_N})^2 + (Z_{\hat{y}_{N2}} - \overline{Z}_{\hat{y}_N})^2 + \ldots + (Z_{\hat{y}_{Nn}} - \overline{Z}_{\hat{y}_N})^2\right]} \quad (9)$$

$$\overline{Z}_{\hat{y}_N} = \frac{1}{n}(Z_{\hat{y}_{N1}} + Z_{\hat{y}_{N2}} + \ldots + Z_{\hat{y}_{Nn}}) \quad (10)$$

wherein $\overline{Z}_{\hat{y}_N}$ is the mean of the standardized virtual metrology values.

Hereinafter, the method for calculating the reference predication values ($Z_{\hat{y}_{r_i}}$ and $\hat{\sigma}_{Z_{\hat{y}_r}}$) from the MR model is explained.

The basic assumption of the MR is that "for given $Z_{x_{i,j}}$, $Z_{y_{ri}}$ is the distribution with mean $\mu_{Z_{yi}}$ and standard deviation $\sigma_{Z_y}$", namely for given $Z_{x_{ij}}$, $Z_{y_{ri}} \sim N(\mu_{Z_{yi}}, \sigma_{Z_y}^2)$, wherein the MR estimating equation of $\hat{\mu}_{Z_{\hat{y}i}}$ is $\hat{\mu}_{Z_{yi}} = Z_{\hat{y}_{ri}}$, and the MR estimating equation of $\sigma_{Z_y}^2$ is $\hat{\sigma}_{Z_y}^2 = \hat{\sigma}_{Z_{\hat{y}_N}}^2$, To obtain the MR relationship between the n sets of standardized process data ($Z_{x_{i,j}}$, i=1, 2, . . . , n; j=1, 2, . . . , p) and the n standardized actual measurement values, ($Z_{y_i}$, i=1, 2, . . . , n), the weighting factors $\beta_r = [\beta_{r0}, \beta_{r1}, \beta_{r2}, \ldots, \beta_{rp}]^T$ corresponding to those p parameters must be defined by using the MR analysis. The relationship between $Z_{y_i}$ and $Z_{x_{i,j}}$ thus is constructed as follows:

$$\beta_{r0}+\beta_{r1}Z_{x_{1,1}}+\beta_{r2}Z_{x_{1,2}}+\ldots+\beta_{rp}Z_{x_{1,p}}=Z_{y_1}$$
$$\beta_{r0}+\beta_{r1}Z_{x_{2,1}}+\beta_{r2}Z_{x_{2,2}}+\ldots+\beta_{rp}Z_{x_{2,p}}=Z_{y_2}$$
$$\beta_{r0}+\beta_{r1}Z_{x_{n,1}}+\beta_{r2}Z_{x_{n,2}}+\ldots+\beta_{rp}Z_{x_{n,p}}=Z_{y_n} \quad (11)$$

Let $$Z_y = \begin{pmatrix} Z_{y_1} \\ Z_{y_2} \\ \vdots \\ Z_{y_n} \end{pmatrix} \quad (12)$$

and $$Z_x = \begin{pmatrix} 1 & Z_{x_{1,1}} & \cdots & Z_{x_{1,p}} \\ 1 & Z_{x_{2,1}} & \cdots & Z_{x_{2,p}} \\ \vdots & \vdots & \ddots & \vdots \\ 1 & Z_{x_{n,1}} & \cdots & Z_{x_{n,p}} \end{pmatrix} \quad (13)$$

The least square method can obtain the estimating equation of $\beta_r$, $\hat{\beta}_r = [\hat{\beta}_{r0}, \hat{\beta}_{r1}, \ldots, \hat{\beta}_{rp}]^T$ as $$\hat{\beta}_r = (Z_x^T Z_x)^{-1} Z_x^T Z_y \quad (14)$$

Therefore, the MR reference model can be obtained as $$Z_{\hat{y}_{r_i}} = \hat{\beta}_{r0} + \hat{\beta}_{r,1}Z_{x_{i,1}} + \hat{\beta}_{r,2}Z_{x_{i,2}} + \ldots + \hat{\beta}_{rp}Z_{x_{i,p}}$$
$$i=1,2,\ldots,n,n+1,\ldots m \quad (15)$$

Hence, during the conjecture phase, after inputting a set of process data, its MR estimating value $Z_{\hat{y}_{r_i}}$ corresponding thereto can be obtained via equation (15). The MR estimating equation of the standard deviation $\sigma_{Z_y}$ is $\hat{\sigma}_{Z_{\hat{y}_r}}$ with $$\hat{\sigma}_{Z_{\hat{y}_r}} = \sqrt{\frac{1}{n-1}\left[(Z_{\hat{y}_{r_1}} - \overline{Z}_{\hat{y}_r})^2 + (Z_{\hat{y}_{r_2}} - \overline{Z}_{\hat{y}_r})^2 + \ldots + (Z_{\hat{y}_{r_n}} - \overline{Z}_{\hat{y}_r})^2\right]} \quad (16)$$

$$\overline{Z}_{\hat{y}_r} = \frac{1}{n}(Z_{\hat{y}_{r_1}} + Z_{\hat{y}_{r_2}} + \ldots + Z_{\hat{y}_{r_n}}) \quad (17)$$

After obtaining the NN estimating equations ($Z_{\hat{y}_{Ni}}$ and $\hat{\sigma}_{Z_{\hat{y}_N}}$) and the MR estimating equations ($Z_{\hat{y}_{r_i}}$ and $\hat{\sigma}_{Z_{\hat{y}_r}}$), their normal distribution curves can be depicted, as illustrated in FIG. 1. Thus, the RI of each virtual metrology value can be derived by calculating the intersection area value (overlap area A).

After obtaining the RI, the RI threshold value ($RI_T$) must be defined. If $RI \geq RI_T$, then the reliance level of the virtual metrology value is acceptable. A systematic approach for determining the $RI_T$ is described below.

Before determining the $RI_T$, it is necessary to define a maximal tolerable error limit ($E_L$). The error of the virtual metrology value is an absolute percentage of the difference between the actual measurement value $y_i$ and $\hat{y}_{Ni}$ obtained from the NN conjecture model divided by the mean of all the actual measurement values, $\overline{y}$, namely $$\text{Error}_i = \left|\frac{y_i - \hat{y}_{Ni}}{\overline{y}}\right| \times 100\% \quad (18)$$

Figure 2:
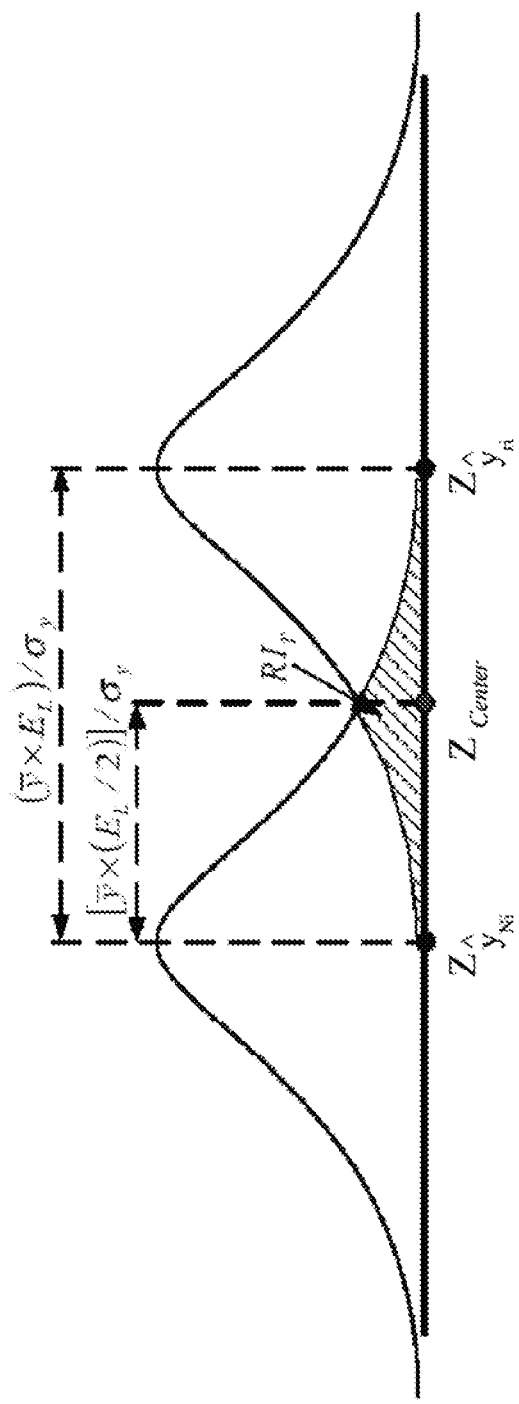
FIG. 2 is a schematic diagram for defining a RI threshold ($RI_T$) according to some embodiments of the present invention.

The $E_L$ can then be specified based on the error defined in equation (18) and the accuracy specification of virtual metrology (VM). Consequently, $RI_T$ is defined as the RI value corresponding to the $E_L$, as shown in FIG. 2. That is $$RI_T = 2 \int_{Z_{Center}}^{\infty} \frac{1}{\sqrt{2\pi}\,\sigma} e^{\frac{1}{2}\left(\frac{x-\mu}{\sigma}\right)^2} dx \quad (19)$$

with $\mu$ and $\sigma$ defined in equation (4) and $$Z_{Center} = Z_{\hat{y}_{Ni}} + [\overline{y} \times (E_L/2)]/\sigma_y \quad (20)$$

where $\sigma_y$ is specified in equation (3).

The following explains a method for building a GSI model. As mentioned above, when virtual metrology is applied, no actual measurement value is available to verify the accuracy of the virtual metrology value. Therefore, instead of the standardized actual measurement value $Z_{y_i}$, the standardized MR prediction value $Z_{\hat{y}_{r_i}}$ is adopted to calculate the RI. This substitution may cause inevitable gauging errors in the RI. To compensate for this unavoidable substitution, a global similarity index (GSI) is provided to help the RI gauge the reliance level of virtual metrology and identifying the key process parameters with large deviations (z score values).

The GSI assesses the degree of similarity between any set of process data and the model set of process data. This model set is derived from all of the sets of historical process data used for building the conjecture model.

The present invention may utilize a statistical distance measure, such as Mahalanobis distance, to quantify the degree of similarity. Mahalanobis distance is a distance measure introduced by P. C. Mahalanobis in 1936. This measure is based on correlation between variables to identify and analyze different patterns of sample sets. Mahalanobis distance is a useful way of determining similarity of an unknown sample set to a known one. This method considers the correlation of the data set and is scale-invariant, namely it is not dependent on the scale of measurements. If the data set has high similarity, the calculated Mahalanobis distance calculated will be relatively small.

The present invention uses the calculated GSI (applying Mahalanobis distance) size to determine whether the newly input set of process data is similar to the model set of process data. If the calculated GSI is small, the newly input set is relatively similar to the model set. Thus the virtual metrology value of the newly input (high-similarity) set is relatively accurate. On the contrary, if the calculated GSI is too large, the newly input set is somewhat different from the model set. Consequently, the virtual metrology value estimated in accordance with the newly input (low-similarity) set has low reliance level in terms of accuracy.

The equations to calculate the standardized process data $Z_{x_{i,j}}$ of the conjecture model are shown in equations (5), (6) and (7). At first, the model set of the process parameters is defined as $X_M = [x_{M,1}, x_{M,3}, \ldots, x_{M,p}]^T$, where $x_{M,j}$ equals $\bar{x}_j$, $j=1, 2, \ldots, p$, so that each element in the model set after standardization (also denoted as the standardized model parameter, $Z_{M,1}$) has a value of 0. Restated, all of the elements in $Z_M = [Z_{M,1}, Z_{M,2}, \ldots, Z_{M,p}]^T$ are 0. Thereafter, the correlation coefficients between the standardized model parameters are calculated.

Assuming that the correlation coefficient between the s-th parameter and the t-th parameter is $r_{st}$ and that there are k sets of data, then $$r_{st} = \frac{1}{k-1} \sum_{l=1}^{k} z_{s1} \cdot z_{t1} = \frac{1}{k-1}(z_{s1} \cdot z_{t1} + z_{s2} \cdot z_{t2} + \ldots + z_{sk} \cdot z_{tk}) \quad (21)$$

After calculating the correlation coefficients between the standardized model parameters, the matrix of correlation coefficients can be obtained as $$R = \begin{bmatrix} 1 & r_{12} & \ldots & r_{1p} \\ r_{21} & 1 & \ldots & r_{2p} \\ \vdots & \vdots & \ddots & \vdots \\ r_{p1} & r_{p2} & \ldots & 1 \end{bmatrix} \quad (22)$$

Assuming that the inverse matrix ($R^{-1}$) of R is defined as A, then $$A = R^{-1} = \begin{bmatrix} a_{11} & a_{12} & \ldots & a_{1p} \\ a_{21} & a_{22} & \ldots & a_{2p} \\ \ldots & \ldots & \ldots & \ldots \\ a_{p1} & a_{p2} & \ldots & a_{pp} \end{bmatrix} \quad (23)$$

Hence, the equation for calculating the Mahalanobis distance ($D_\lambda^2$) between the standardized λ-th set process data ($Z_\lambda$) and the standardized model set process data ($Z_M$) is as follows.

$$D_\lambda^2 = (Z_\lambda - Z_M)^T R^{-1} (Z_\lambda - Z_M) \quad (24)$$
$$= Z_\lambda^T R^{-1} Z_\lambda$$

Finally, equation (25) is obtained.

$$D_\lambda^2 = \sum_{j=1}^{p} \sum_{i=1}^{p} a_{ij} z_{i\lambda} z_{j\lambda} \quad (25)$$

The GSI of the standardized λ-th set process data is, then, equal to $D_\lambda^2/p$.

After obtaining the GSI, the GSI threshold ($GSI_T$) should be defined as the following:

$$GSI_T = a * \overline{GSI}_{LOO} \quad (26)$$

In the so-called cross validation's leave-one-out (LOO) method, one sample data set is selected from all sets of process data used for building models as a simulated on-line test sample set, and then the remaining sets of process data are utilized to construct a GSI model, and thereafter the GSI model is used to compute a GSI value for the test sample set, i.e. $GSI_{LOO}$. The above steps are repeated on all of the sample data sets (process data) used for building models, thus computing all of the $GSI_{LOO}$ values of the respective sample data sets. Therefore, $\overline{GSI}_{LOO}$ shown in equation (26) stands for, for example, the 90% trimmed mean of all the $GSI_{LOO}$ values computed by the sample data sets respectively. The "a" shown in equation (26) is between 2 and 3, and can be slightly adjusted in accordance with the actual conditions, wherein "a" is predetermined to be 3.

A method for constructing a $DQI_x$ model is described as follows. Assume that n sets of historical process data are received for constructing the first $DQI_x$ model, wherein each set of historical process data is composed of p parameters. These n sets of historical process data are applied to generate p eigenvectors with p corresponding eigenvalues ($\lambda_1 \geq \lambda_2 \geq \ldots \geq \lambda_p$) in descending order by the principal component analysis (PCA). Then, a set of k significant eigenvalues (with $\lambda \geq 1$) is selected for constructing a feature-extraction matrix M, which is expressed as:

$$M = \begin{bmatrix} [\text{eigenvector } 1] \\ [\text{eigenvector } 2] \\ \vdots \\ [\text{eigenvector } k] \end{bmatrix}_{k*p} \quad (27)$$

The method for computing the $DQI_x$ value is explained as follows.

At first, equation (28) is applied to transform the $i^{th}$ input set of process data $X_i$ to k data feature variables $A_i$ [$a_1, a_2, \ldots, a_k$].

$$A_i = M \bullet X_i \quad (28)$$

Then, these k data feature variables are transformed to $$Z_A = [z_{a_j}, z_{a_j}, \ldots, z_{a_j}],$$

which is then converted by the Euclidean distance (ED) algorithm into a consolidated index, i.e. $DQI_x$ value:

$$DQI_{X_i} = \sqrt{\sum_{j=1}^{k} (z_{a_{i,j}} - z_{a_j}) * (z_{a_{i,j}} - z_{a_j})^T} \quad (29)$$

where i represents the $i^{th}$ input set of process data;
$\overline{Z}_{a_j}$: the mean of the j-th standardized variable of the training samples.

Theoretically, the value of $\overline{Z}_{a_j}$ is zero, and therefore Equation (29) can be simplified as:

$$DQI_{X_i} = \sqrt{\sum_{j=1}^{k} (z_{a_{i,j}}) * (z_{a_{i,j}})^T} \quad (30)$$

Meanwhile, the cross validation's leave-one-out (LOO) method is used to determine process data quality threshold $(DQI_{X_T})$ as:

$$DQI_{X_T} = a * \overline{DQI_{X_{LOO}}} \quad (31)$$

In the so-called cross validation's leave-one-out (LOO) method, one sample data set is selected from all sets of process data used for building models as a simulated on-line test sample set, and then the remaining sets of historical process data are utilized to construct a $DQI_x$ model, and thereafter the $DQI_x$ model newly built is used to compute a $DQI_x$ value for the simulated on-line test sample set, i.e. $DQI_{X_{LOO}}$. The above steps are repeated on all of the sample data sets (process data) used for building models, thus computing all of the $DQI_{X_{LOO}}$ values of the respective sample data sets. Therefore, $\overline{DQI_{X_{LOO}}}$ shown in equation (31) stands for, for example, the 90% trimmed mean of all the $DQI_{X_{LOO}}$ values computed by the sample data sets respectively. The "a" shown in equation (31) is between 2 and 3, and can be slightly adjusted in accordance with the actual conditions, wherein "a" is predetermined to be 3.

It is noted that the feature-extraction matrix M and the $DQI_x$ compose a $DQI_x$ model, and the $DQI_x$ model will be updated (in the model-refreshing procedure) in accordance with a condition for retraining or tuning.

Thereafter, Z-score values of the historical process data are computed. Then, a $DQI_y$ model is created, in which the $DQI_y$ model is composed of m similar patterns.

In the present embodiment, the m similar patterns $\{P_1, P_2, \ldots, P_m\}$ are sorted from Z-score values of those n sets of historical process data by applying adaptive resonance theory 2 (ART2) with ρ=0.98.

The method for computing the $DQI_y$ values is described as follows. At first, when a new actual measurement value y is collected, the Z-score value $Z_{x_{G_j}}$ corresponding to the actual measurement value $y_j$ are applied by the adaptive resonance theory 2 (ART2) to search for the most similar pattern $P_q=[X_{q,1}, X_{q,2}, \ldots, X_{q,v}]$ from the similar patterns $\{P_1, P_2, \ldots, P_m\}$. Then, the v samples (v≥2) inside the $P_q=[X_{q,1}, X_{q,2}, \ldots, X_{q,v}]$ with their corresponding actual measurement values, $Y_q=[y_{q,1}, y_{q,2}, \ldots, y_{q,v}]$, and this new actual measurement value $y_j$ are utilized to compute the $DQI_{y_j}$ and the threshold value $(DQI_{y_r})$ of the $DQI_y$. The $DQI_{y_j}$ of $y_j$ is obtained as normalized variability (NV):

$$DQI_{y_j} = \frac{|y_j - \overline{y}_q|}{\overline{y}_q} \quad (32)$$

where $$\overline{y}_q = \frac{1}{v} \sum_{l=1}^{v} y_{q,l} \quad (33)$$

where $\overline{y}_q$: the mean of all $y_{q,l}$ in $Y_q$;
v: the number of samples inside the pattern $P_q$.

The $DQI_{y_r}$ of a certain pattern $P_q$ is defined to be the maximal-tolerable variance of the $P_q$. Suppose that $y_t$ is the maximal-tolerable metrology value that possesses the maximal-tolerable variance in $P_q$ then $y_t$ can be presented as:

$$y_t = \overline{y}_q + R_{max} \text{ or } y_t = \overline{y}_q - R_{max} \quad (34)$$

where $R_{max}$ is the maximal-tolerable variance;

$$R_{max} = \max(R_{P_1}, R_{P_2}, \ldots, R_{P_m}) \quad (35)$$

where $R_{P_i}=1, 2, \ldots, m$, is the range in pattern $P_i$, and m is the total number of all the similar-pattern groups.

By adding $y_t$ into the similar pattern $P_q$, the $DQI_{y_t}$ can be acquired as:

$$DQI_{y_T} = \frac{|y_t - \overline{y}_q|}{\overline{y}_q} \quad (36)$$

After obtaining the $DQI_{y_j}$ and $DQI_{y_t}$, if $DQY_{y_j} > DQI_{y_r}$ is true, then it means that the new actual measurement value is abnormal; otherwise, the new actual measurement value is normal.

The aforementioned PCA, LOO, ART2, Z-score and ED algorithms all are known to one having ordinary skill in the art, and thus the details thereof are not described herein.

Figure 3:
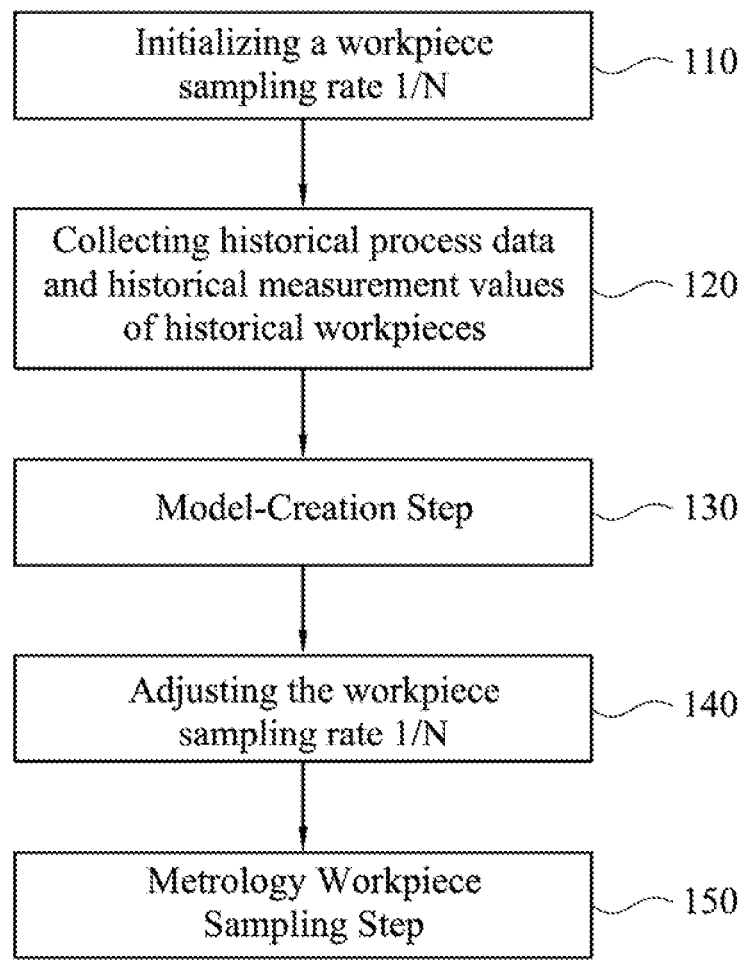
FIG. 3 is a schematic flow chart showing a metrology sampling method with a sampling rate decision scheme according to various embodiments of the present invention.

Referring to FIG. 3, FIG. 3 is a schematic flow chart showing a metrology sampling method with a sampling rate decision scheme according to various embodiments of the present invention. At first, a workpiece sampling rate 1/N is initialized (step 110), in which the workpiece sampling rate is directed to selecting the $N^{th}$ workpiece in each N workpieces processed by a process tool as a workpiece expected to be measured. For example, a conventional workpiece sampling rate workpiece is defined as selecting the $25^{th}$ workpiece in each 25 workpieces (workpiece count=25) as a workpiece expected to be measured after the each 25 workpieces are processed by the process tool. Embodiments of the present invention adopts a variable "workpiece count" to enable the application of the workpiece sampling rate of which the initial value is 0. In other words, the workpiece count is the number of workpieces which have been processed by the process tool but do not undergo metrology after the most recent workpiece was performed by metrology. In step 110, N may be initialized to 1 or a numeric set by a conventional manufacturing system. Theoretically, the workpiece with the workpiece count equal to N will be selected as the workpiece expected to be measured. Thereafter, a plurality of sets of historical process data used by the process tool for processing a plurality of historical workpieces are collected, and a plurality of historical measurement values of the historical workpieces corresponding to the sets of historical process data are collected (step 120). Then, a model-creation step 130 is performed to build a RI model (a conjecture model and a reference model), a $DQI_x$ model, a $DQI_y$ model and a GSI model, and to compute a $DQI_x$ threshold, a $DQI_y$ threshold and a GSI threshold, in which the conjecture model is used for computing virtual metrology values of workpieces. The details of the model-creation step 130 are explained in the above. After the model-creation step 130 is completed, a step 140 of adjusting the workpiece sampling rate is performed for adjusting the value of N of the workpiece sampling rate. After the value of N is automatically adjusted, a metrology workpiece sampling step 150 can then be performed for further reducing the workpiece sampling rate. The step 140 of adjusting the workpiece sampling rate is based on the virtual metrology (VM) accuracy for adjusting the workpiece sampling rate, in which, when the VM accuracy is poor, the workpiece sampling rate is increased (by decreasing N); and when the VM accuracy is good, the workpiece sampling rate is decreased or sustained (by increasing or retaining N). Hence, after the step 140 of adjusting the workpiece sampling rate, the workpiece sampling rate has been properly adjusted. Then, a user may use the aforementioned workpiece sampling rate to perform the metrology workpiece sampling step 150.

Hereinafter, technical principles of the step 140 of adjusting the workpiece sampling rate are explained. In embodiments of the present invention, each workpiece delivered to the process tool is added to a set of determinative samples (hereinafter referred to as a DS set), a mean absolute percentage error (MAPE) and a maximum absolute percentage error (MaxErr) of visual metrology values of all workpieces in the DS set, referred to as $MAPE_{DS}$ and $MaxErr_{DS}$, are computed for determining the VM accuracy, in which the mean absolute percentage error (MAPE) and the maximum absolute percentage error (MaxErr) are defined as:

$$MAPE = \frac{\sum_{i=1}^{n} |(\hat{y}_i - y_i)/y|}{n} \times 100\% \quad (37)$$

$$\text{Max Error} = \max\left\{\left|\frac{(\hat{y}_i - y_i)}{y}\right| \times 100\%, i = 1, 2, \ldots, n\right\} \quad (38)$$

where $\hat{y}_i$ represents a VM value; $y_i$ represents an actual measurement value; y represents a target value; and n represents the number of workpieces in the DS set.

The DS set needs to collect enough number of workpieces to have representativeness. However, if there are too many workpieces in the DS set, a lot of time will be consumed. Hence, a threshold of the number of determinative samples (referred to as $T_{DS}$) has to be a proper value. The closer the MAPE and MaxErr are to zero, the better VM accuracy is achieved. Embodiments of the present invention use a specification of virtual metrology maximum error for the process tool (referred to as $SPEC_{Max}$), an upper control limit of MaxErr (Referred to as $UCL_{Max}$), and an upper control limit of MAPE (Referred to as $UCL_{MAPE}$) to determined if the workpiece sampling rate needs adjusting, in which the equations of $UCL_{Max}$ and $UCL_{MAPE}$ are listed below:

$$UCL_{MAX} = \alpha \times SPEC_{Max} \quad (39)$$

$$UCL_{MAPE} = \beta \times SPEC_{Max} \quad (40)$$

in which $SPEC_{Max}$ varies due to the physical properties of the process tool; α is a first conservative factor; β is a second conservative factor; 0<α, β≤1; and α>β. The aforementioned $T_{DS}$, α, β may be determined by sensitivity analysis. For an example of plasma-enhanced chemical vapor deposition (PECVD) process tool, $T_{DS}$ may be 5; $SPEC_{Max}$ may be 1.08%; a may be 0.85; and 1 may be 0.65, and thus $UCL_{Max}$ is 0.92% and $UCL_{MAPE}$ is 0.70%.

Figure 4A:
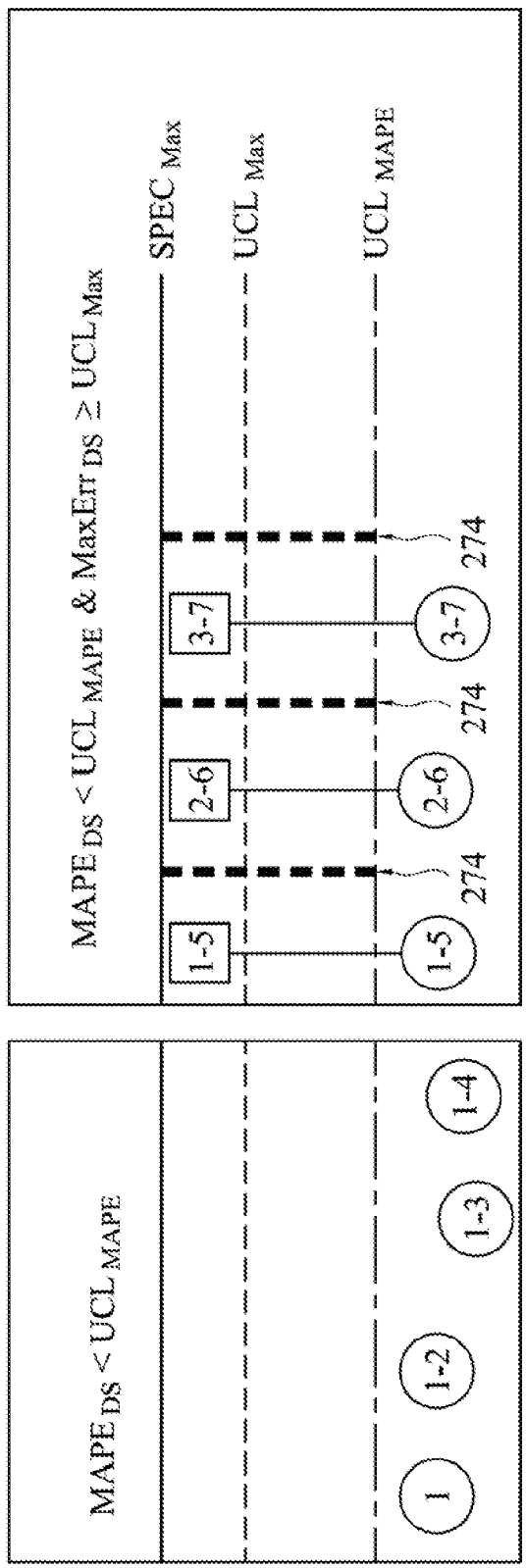
FIG. 4A to FIG. 4C are schematic diagrams used for explaining a step of adjusting a workpiece sampling rate according to some embodiments of the present invention.
Figure 4B:
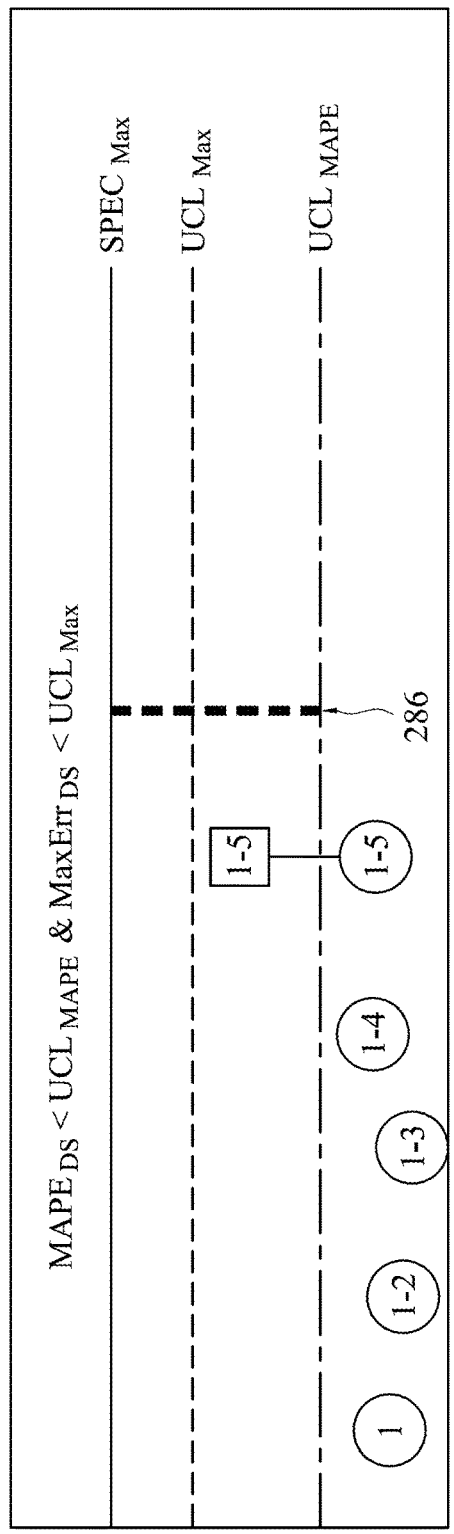
Figure 4C:
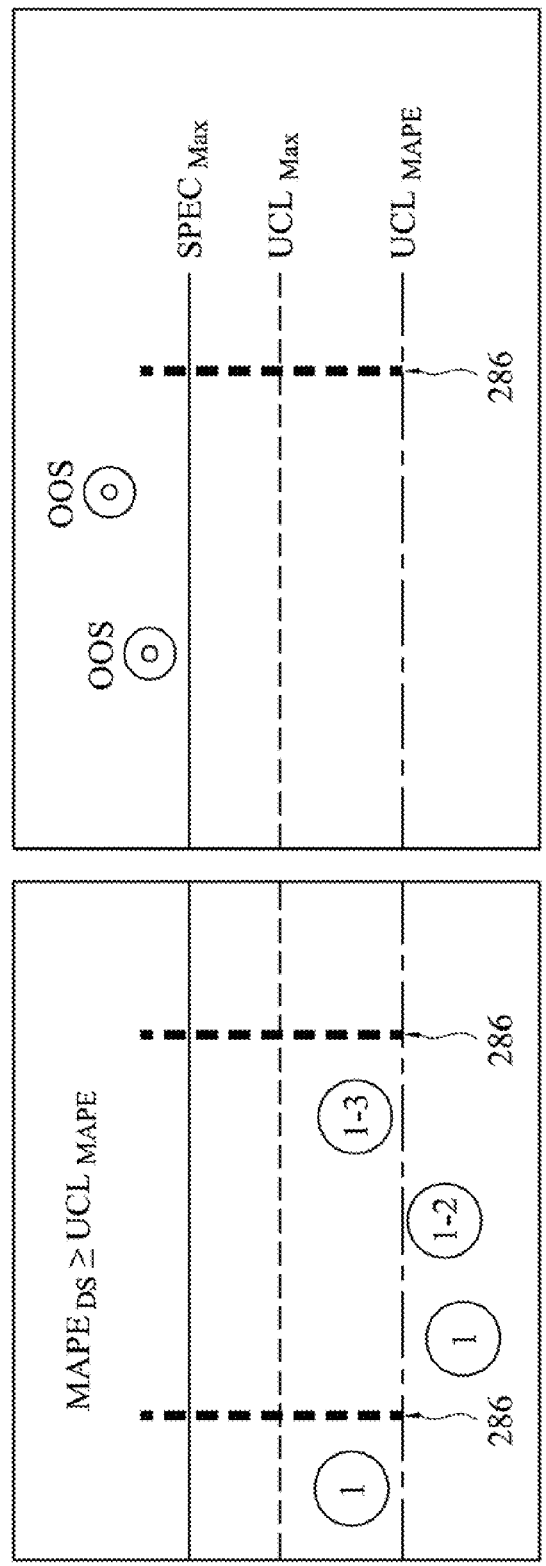

Referring to FIG. 4A to FIG. 4C, FIG. 4A to FIG. 4C are schematic diagrams used for explaining the step 140 of adjusting the workpiece sampling rate according to some embodiments of the present invention, in which "○" stands for $MAPE_{DS}$ (a mean absolute percentage error of visual metrology values of all workpieces in the DS set); "□" stands for $MaxErr_{DS}$ (a maximum absolute percentage error of visual metrology values of all workpieces in the DS set); "1-3" in the "○" and "□" (the DS set) stands for the first workpiece to the third workpiece sequentially delivered to the process tool; "2-6" in the "○" and "□" (the DS set) stands for the second workpiece to the sixth workpiece sequentially delivered to the process tool; "3-7" in the "○" and "□" (the DS set) stands for the third workpiece to the seventh workpiece sequentially delivered to the process tool; and "⊙" stands for an OOS (Out of Spec) event.

As shown in FIG. 4A, the cases of retaining the workpiece sampling rate unchanged are illustrated. During a process of collecting determinative samples (workpieces), while the number of the determinative samples collected in the DS set is smaller than $T_{DS}$, $MAPE_{DS}$ is used to check whether the current workpiece sampling rate 1/N needs to be changed or not. In this example, $T_{DS}$ is set to be 5 for illustrative purpose. As shown in the left half of FIG. 4A, when the $MAPE_{DS}$ of each of the DS sets ("1", "1-2", "1-3", "1-4") formed from the first four workpieces is smaller than $UCL_{MAPE}$, the workpiece sampling rate is retained unchanged. When the number of the determinative samples collected in the DS set reaches $T_{DS}$ (5), not only the $MAPE_{DS}$ but also the $MaxErr_{DS}$ are adopted to determine the workpiece sampling rate 1/N. As shown in the right half of FIG. 4A, when the $MaxErr_{DS}$ of the DS set ("1-5") composed of the first workpiece to the fifth workpiece is greater than $UCL_{MAPE}$ and the $MAPE_{DS}$ of the DS set ("1-5") is still smaller than $UCL_{MAPE}$, meaning that the VM accuracy is moderate, the workpiece sampling rate is retained unchanged. Thereafter, the oldest sample in the DS set is discarded (step 274), thereby preventing too many workpieces in the DS set consuming too much time.

As shown in FIG. 4B, the cases of reducing the workpiece sampling rate 1/N (increasing N) are illustrated. In this example, $T_{DS}$ is set to be 5 for illustrative purpose. When the number of the determinative samples collected in the DS set ("1-5") is equal to $T_{DS}$ (5), if the $MAPE_{DS}$ of the DS set ("1-5") is smaller than $UCL_{MAPE}$, and the $MaxErr_{DS}$ of the DS set ("1-5") is also smaller than $UCL_{MAPE}$, meaning that the VM accuracy is good and the VM values are accurate enough to represent the actual measurement values, the workpiece sampling rate 1/N can be decreased. Then, the DS set is cleared and an OOS count is reset to 0 (step 286), in which the function of the OOS count will be explained later. Clearing the DS set means to start a fresh new collection of determinative samples, i.e. the number of workpieces in the DS set (referred to as $SIZE_{DS}$) is reset to 0; and resetting the OOS count to 0 means to re-count the times of occurrence of OOS.

As shown in the left half of FIG. 4C, the cases of increasing the workpiece sampling rate 1/N (decreasing N) are illustrated. When the number of determinative samples collected in the DS set is smaller than $T_{DS}$, and the VM value $MAPE_{DS}$ is greater than $UCL_{MAPE}$, it means that the VM accuracy is poor and the VM value fails to represent the actual measurement value of the workpiece, and thus the workpiece sampling rate 1/N is needed to be increased. Then, the DS set is cleared and an OOS count is reset to 0 (step 286).

As shown in the right half of FIG. 4C, when an absolute error percentage of a VM value of a workpiece is greater the $SPEC_{Max}$ of the process tool processing the workpiece, it means that the VM value has a very big error or the VM accuracy is rapidly decreased, such that an OOS event occurs. In order to avoid adjusting the workpiece sampling rate 1/N too frequently or too hastily, the present embodiment introduces the "OOS count" to count the times of occurrence of OOS events. When the OOS count is greater than or equal to a OOS threshold (for example, 2; i.e. at least two consecutive OOS events have been recorded.), the workpiece sampling rate 1/N is increased, and then the DS set is cleared and an OOS count is reset to 0 (step 286).

A status change of the process tool may occur when tool maintenance, repair, or recipe adjustment is performed. This status change can be notified by an event sent from the manufacturing execution system. At this moment, the current N value may be no longer suitable for use because the process features are changed. The present embodiment obtains a minimum workpiece sampling rate represented by $1/N_{max}$ and a default workpiece sampling rate represented by $1/N_{default}$ to re-define the value of N, in which $N_{max}$ is a maximum value of N, and $N_{default}$ is a default value of N. When $(\gamma \times N_{max})$ is greater than $N_{default}$, $N_{default}$ set to $(\gamma \times N_{max})$, in which $\gamma$ is a third conservative factor and $0 < \gamma \le 1$. In some embodiment, $(\gamma \times N_{max})$ is rounded up to the nearest whole number. In the example of PECVD, $\gamma$ may be 2/3, and thus $N_{default}$ is 4 when $N_{max}$ is 6. If a status change of the process tool occurs and the current workpiece sampling rate 1/N (for example, N=5) is smaller than $1/N_{default}$ ($N > N_{default}$), the workpiece sampling rate 1/N is set to $1/N_{default}$, or (for example, N=2), the current workpiece sampling rate 1/N is retained unchanged.

Hereinafter, a flow process of the step 140 (as shown in FIG. 3) of adjusting the workpiece sampling rate is explained, wherein the step 140 includes a sampling rate adjusting step 200 shown in FIG. 5A and FIG. 5B. In the sampling rate adjusting step 200, at first, a set of process data of a workpiece currently processed by the process tool and an actual measurement value of the workpiece corresponding to the set of process data are obtained, in which the process tool uses the set process data to process the workpiece. Then, the $DQI_x$ value, the $DQI_y$ value, the GSI value or the RI value of the workpiece may be optionally checked to determine if they meet the requirements of their respective thresholds, i.e., if $RI \ge RI_T$; $GSI \le GSI_T$; $DQI_x \le DQI_{x_T}$; $DQI_y \le DQI_{y_T}$ (step 210). When the result of step 210 is false ("no"), it means that the set of process data and/or the actual of the workpiece are not reliable and the sampling rate adjusting step 200 cannot proceed, and thus step 280 is performed to retain the workpiece sampling rate 1/N unchanged (i.e. the value of N is unchanged). When the result of step 210 is true ("yes"), it means that the set of process data and/or the actual of the workpiece are reliable and step 220 can be performed to add the workpiece to a set of determinative samples (a DS set). Thereafter, the set of process data of the workpiece is inputted into the conjecture model created by the model-creation step 130 (shown in FIG. 3), thereby computing an absolute percentage error of the virtual metrology value of the workpiece, a mean absolute percentage error ($MAPE_{DS}$) of virtual metrology values of all workpieces in the DS set, and a maximum absolute percentage error ($MaxErr_{DS}$) of virtual metrology values of all workpieces in the DS set (step 230).

Then, step 240 is performed to determine if the absolute percentage error of the virtual metrology value of the workpiece is greater than the $SPEC_{Max}$ of the process tool, thereby obtaining a first result. When the first result is true ("yes"), the OOS (Out of Spec) count is increased by 1. When the first result is false ("no"), step 260 is performed to compute and determine if the mean absolute percentage error ($MAPE_{DS}$) of virtual metrology values of all workpieces in the DS set is greater than or equal to $UCL_{MAPE}$, thereby obtaining a second result. When the second result is true ("yes"), step 284 is performed to increase the workpiece sampling rate 1/N (i.e. to decrease the value of N, for example, to subtract 1 from N). Thereafter, step 286 is performed to reset the OOS count to 0 and clear the DS set, i.e. to set the number of workpieces in the DS set ($SIZE_{DS}$ to 0). When the second result is false ("no"), step 270 is performed to determine if $SIZE_{DS}$ is greater than or equal to the threshold of the number of determinative samples ($T_{DS}$), thereby obtaining a third result.

When the third result is false ("no"), step 280 is performed to retain the workpiece sampling rate 1/N unchanged. When the third result is true ("yes"), step 272 is performed to compute and determine if the maximum absolute percentage error ($MaxErr_{DS}$) of virtual metrology values of all workpieces in the DS set is smaller than $UCL_{Max}$, thereby obtaining a fourth result. When the fourth result is true ("yes"), step 282 is performed to decrease the workpiece sampling rate 1/N (i.e. to increase the value of N, for example, to add 1 to N). Thereafter, step 286 is performed to clear the DS set and reset the OOS count to 0. When the fourth result is false ("no"), step 274 is performed to discard the oldest workpiece in the DS set, and step 280 is performed to retain the workpiece sampling rate unchanged.

When the first result (step 240) is true ("yes"), step 250 is performed to determine if the OOS count is greater than or equal to an OOS threshold (for example, 2), thereby obtaining a fifth result. When the fifth result is true ("yes"), step 284 is performed to increase the workpiece sampling rate 1/N (i.e. to decrease N, for example, to subtract 1 from N), and then step 286 is performed to clear the DS set and set the OOS count to 0.

After step 280 or step 286 is performed, the minimum workpiece sampling rate represented by $1/N_{max}$ and the default workpiece sampling rate represented by $1/N_{default}$ are obtained, in which $N_{max}$ is the maximum value of N used by the process tool in its operation history. Then, step 290 is performed to determine if $(\gamma \times N_{max})$ is greater than $N_{default}$, thereby obtaining a sixth result, in which $\gamma$ is the third conservative factor and $0 < \gamma \le 1$. In some embodiment, $(\gamma \times N_{max})$ is rounded up to the nearest whole number. When the sixth result is true ("yes"), step 292 is performed to set $N_{default}$ to $(\gamma \times N_{max})$. Moreover, in steps 340, 342, 344 and 346 shown in FIG. 6, when a status change of the process tool occurs (step 340) and the workpiece sampling rate 1/N at this moment is smaller than $1/N_{default}$ ($N \ge N_{default}$) (step 344), the workpiece sampling rate 1/N is set to $1/N_{default}$ ($N = N_{default}$) (step 346).

Hereinafter, the five scenarios considered by the scheme of the metrology workpiece sampling step 150 are explained.

Scenario 1: a stable process is considered. When no status-changes of a process tool occur and all of the RI, GSI, $DQI_x$, and $DQI_y$ values of a workpiece processed by the process tool are within their respective thresholds in a manufacturing process, i.e. RI≥RI$_T$; GSI≤GSI$_T$; DQI$_x$≤DQI$_{X_T}$; DQI$_y$≤DQI$_{y_T}$, then this process is stable. At this situation, no actual measurement value is needed to update the VM model, and thus the ASD scheme can set N to a greater number (i.e. a lower predetermined workpiece sampling rate) without affecting the accuracy of VM models.

Scenario 2: the status of the process tool is changed. A possible status change of the process tool may occur when tool maintenance, repair, or recipe adjustment is performed. At this situation, embodiments of the present invention will request an actual measurement for the workpiece which is being processed when the status of the process tool is changed, and reset the workpiece count to 0. For example, if the workpiece originally expected to be measured is the 25$^{th}$ workpiece, and the status of the process tool is changed when the second workpiece is being processed, embodiments of the present invention performs actual metrology on the second workpiece, and the next workpiece expected to be measured is the 27$^{th}$ workpiece.

Scenario 3: the DQI$_x$ value of the workpiece is abnormal (i.e. DQI$_x$>DQI$_{X_T}$). The function of the DQI$_x$ value is to check the quality of the set of process data used by the process tool for processing the workpiece. To prevent abnormal process data from deteriorating the VM models, the workpiece with abnormal DQI$_x$ value should not be selected for measurement. In other words, the measurement for the workpiece with abnormal DQI$_x$ value will be skipped. If the workpiece with abnormal DQI$_x$ value is originally expected (scheduled) to be measured (at this moment, the workpiece count for controlling workpiece sampling is N), embodiments of the present invention does not perform actual metrology on the workpiece, but instead, request an actual measurement on a next workpiece. If the DQI$_x$ value of this next workpiece is normal (at this moment, the workpiece count for controlling workpiece sampling is greater than N), actual metrology is performed on this next workpiece. If the DQI$_x$ value of this next workpiece is still abnormal, the measurement of this next workpiece is skipped. Thereafter, the same steps are used to consider another next workpiece sequentially.

Scenario 4: the GSI value or the RI value of the workpiece is abnormal (GSI>GSI$_T$ or RI<RI$_T$). The purpose of the RI value is to gauge the reliance level of a VM value. If the RI value of the workpiece is abnormal (RI<RI$_T$), it represents that the degree of reliability of the VM value of the workpiece is poor, and the actual measurement value of the workpiece is needed to retune or retrain the VM models. The purpose of the GSI value is to evaluate deviations of process data. A process-data deviation of the workpiece may result in a deviation of its corresponding actual measurement value. As such, the workpiece with the abnormal GSI value needs to be inspected. However, if the abnormal RI value or GSI value just happens once, then this may be a false alarm caused by noise or other factors. To confirm that a real deviation is detected, when at least a certain number of consecutive workpieces (such as two or four) have abnormal RI or GSI values, embodiments of the present invention then perform actual metrology on the second or fourth workpiece.

Scenario 5: the DQI$_y$ value of the workpiece is abnormal (i.e. DQI$_y$>DQI$_{y_T}$). The function of the DQI$_y$ value is to evaluate the quality of the actual measurement value of the workpiece. If the quality of the actual measurement value of the workpiece is not good, the actual measurement value of the workpiece cannot be used for retuning or retraining the VM models. Instead, embodiments of the present invention request an actual measurement on a next workpiece promptly.

Hereinafter, a flow process of the metrology workpiece sampling step 150 is explained, wherein the metrology workpiece sampling step 150 includes a sampling step 300 shown in FIG. 6 and step 301 shown in FIG. 7.

In the sampling step 300, at first, a workpiece is provided to a process tool (step 302), in which the process tool has a set of process data used to process the workpiece. The set of process data of the workpiece is inputted into the DQI$_x$ model and the GSI model built in the model-creation step 130, thereby obtaining a DQI$_x$ value, a GSI value and a RI value of the workpiece (step 304). In step 304, the set of process data of the workpiece is also inputted into the conjecture model built in the model-creation step 130, thereby computing a virtual metrology (VM) value of the workpiece; and the set of process data of the workpiece is also inputted into the reference model built in the model-creation step 130, thereby computing a reference prediction value of the workpiece. Thereafter, an overlap area between the statistical distribution of the virtual metrology value of the workpiece and the statistical distribution of the reference prediction value of the workpiece is calculated to generate a RI value of the workpiece, in which the RI increases with increasing overlap area, representing that the corresponding virtual metrology value is more reliable.

Thereafter, step 310 is performed to check if the process tool has been idled for a period of time (for example, idled for more than one day). When the checking result of step 310 is true ("yes"), the workpiece is regarded as the first workpiece after the idle period and step 392 has to be performed to perform metrology on the workpiece by using a metrology tool and set a workpiece count to 0, thereby confirming if the process tool is normal. When the checking result of step 310 is false ("no"), the workpiece count is increased by 1 (step 320). Thereafter, step 340 is performed to check if a status change of the process tool occurs (for example, when tool maintenance, repair, or recipe adjustment etc. is performed.). When the checking result of step 340 is true ("yes"), step 342 is performed to clear the DS set and set the OOS count to 0, and step 344 is performed to check if the value of N is greater than N$_{default}$. When the checking result of step 344 is false ("no"), the metrology tool is used to perform metrology on the workpiece by and the workpiece count is set to 0 (step 392). After Step 346 is performed. Step 392 is also performed for confirming if the process tool is normal.

When the checking result of step 340 is false ("no"), step 350 is performed to check if the DQI$_x$ value of the workpiece is good or bad. When the DQI$_x$ value is greater than the DQI$_x$ threshold, it represents that the quality of the set of process data of the workpiece (the DQI$_x$ value) is not good (the checking result of step 350 is "bad"). Because the actual measurement value of the workpiece produced by using the set of process data with the abnormal DQI$_x$ value is not reliable, the measurement of the workpiece is skipped (step 390). When the DQI$_x$ value is smaller than or equal to the DQI$_x$ threshold, it represents that the quality of the set of process data of the workpiece is good (the checking result of step 350 is "good"), and step 360 is performed to check if the workpiece count is greater than or equal to N. When the checking result of step 260 is true ("yes"), it represents that the workpiece is the workpiece expected (scheduled) to be measured, metrology should be performed on the workpiece and the workpiece count is set to 0 (step 392).

When the checking result of step 360 is false ("no"), step 370 is performed to check if the GSI value and the RI value of the workpiece are good or bad. When the GSI value of the workpiece is smaller than or equal to the GSI threshold and the RI value of the workpiece is greater than or equal to the RI threshold, it represents that the virtual metrology value conjectured by using the set of process data of the workpiece is reliable (the checking result of step 370 is "good"), and thus the workpiece does not need to be measured (step 390). When the GSI value of the workpiece is greater than the GSI threshold or the RI value of the workpiece is smaller than the RI threshold, it represents that the virtual metrology value conjectured by using the set of process data of the workpiece is not reliable (the checking result of step 370 is "bad"), the workpiece may need to be measured. However, if the abnormal RI value or GSI just happens once, it may be a false alarm caused by noise or other factors, and thus, when at least a certain number of consecutive workpieces (such as two or four) have abnormal RI or GSI values, embodiments of the present invention then perform actual metrology on the second or fourth workpiece. In other words, when the checking result of step 370 is "bad", step 380 is performed to check if the GSI values of k workpieces (such as the previous one or three workpieces) processed before the workpiece all are greater than the GSI threshold or the RI values of k workpieces processed before the workpiece all are smaller than the RI threshold, where k is a positive integer. When the checking result of the step 380 is true ("yes"), the metrology tool is used to perform metrology on the workpiece and the workpiece count is set to 0 (step 392). When the checking result of the step 380 is false ("no"), the measurement of the workpiece is skipped (step 390). It is worthy to be noted that step 370 also may only check if the GSI value of the workpiece is good or bad. If the GSI value of the workpiece is too large, it represents that the set of process data of the workpiece have some differences from the sets of process data used for model building, such that the quality of the workpiece is likely to be abnormal, and needs actual metrology. It can be known from the above, with the applications of the embodiments of the present invention, a user may wait until the process tool has processed more workpieces to select a workpiece for measurement, i.e. N can be increased to lower the predetermined workpiece sampling rate 1/N without worrying to skip the measurement of the abnormal workpiece that ought to be measured. Thus, the embodiments of the present invention can effectively lower the predetermined workpiece sampling rate. However, the predetermined workpiece sampling rate also can be effectively lowered by only performing step 350 (checking the $DQI_x$ value of the workpiece), step 360 (checking if the workpiece is the workpiece expected to be measured) and step 370 (checking the GSI value and the RI value of the workpiece, or only checking the GSI value of the workpiece).

Figure 5A:
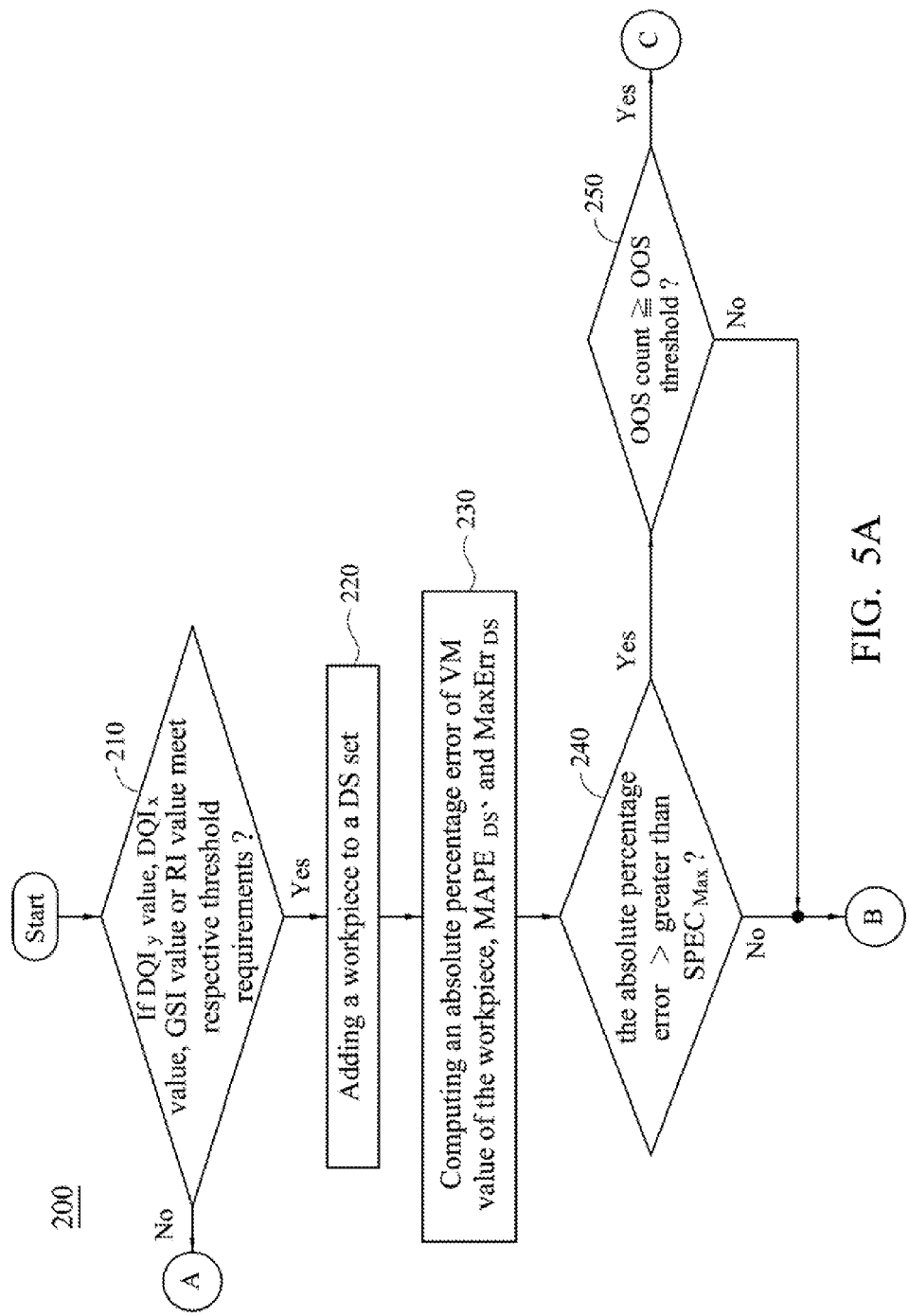
FIG. 5A and FIG. 5B are schematic flow charts showing a step for adjusting a workpiece sampling rate according to various embodiments of the present invention.
Figure 5B:
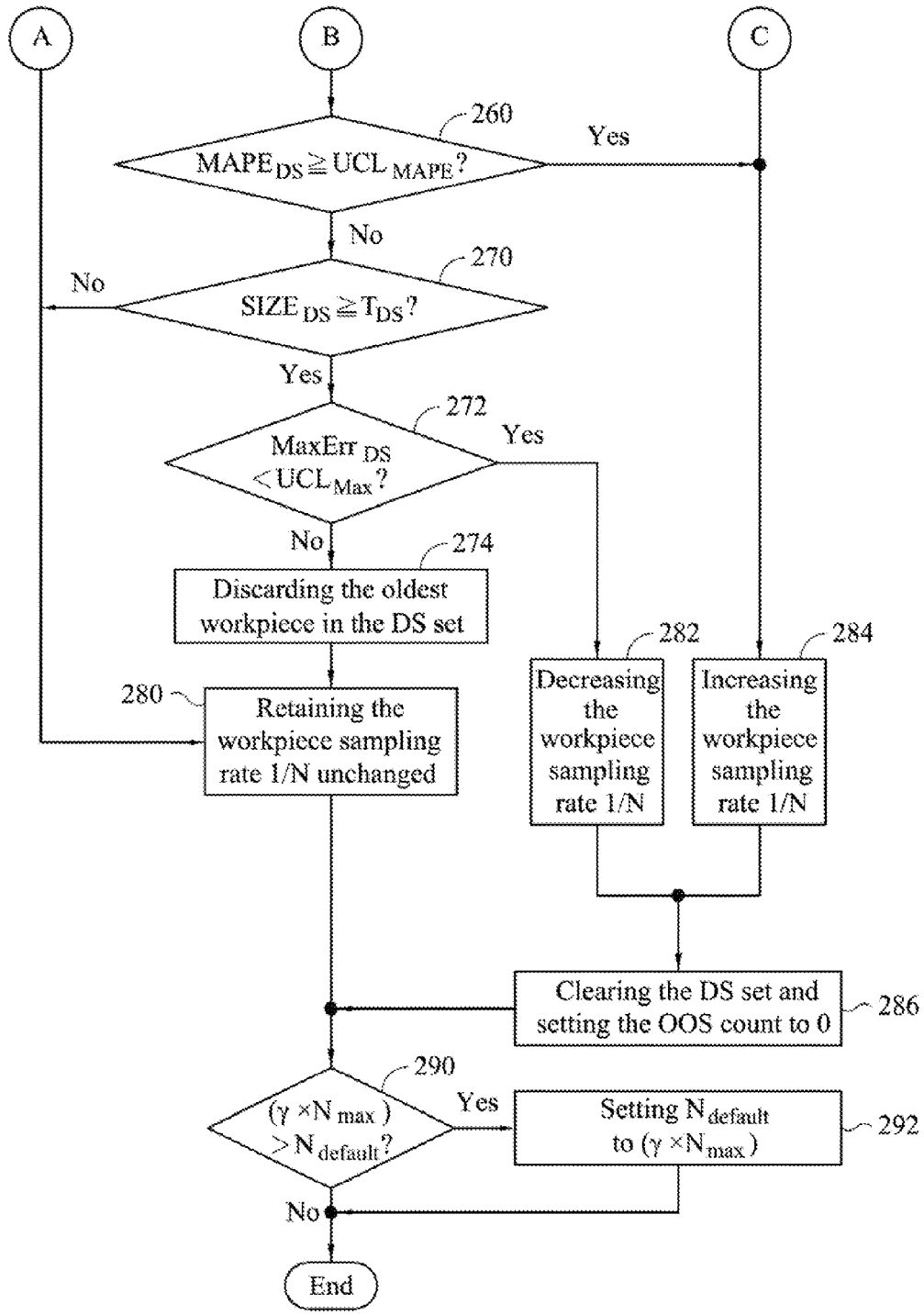
Figure 6:
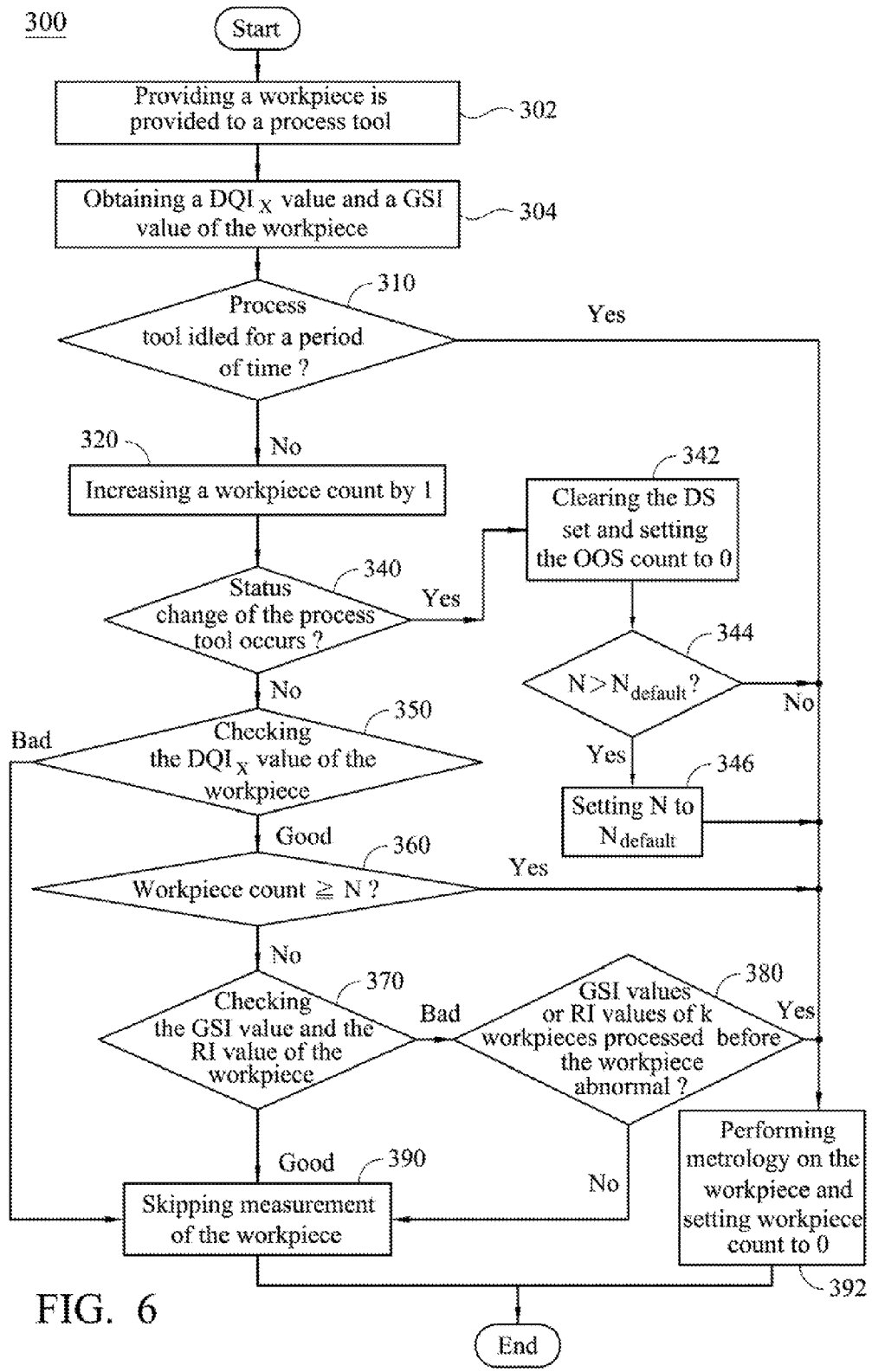
FIG. 6 is a schematic flow chart showing a metrology workpiece sampling step according various embodiments of the present invention.

The first to sixth "results" used for explaining FIG. 5A and FIG. 5B, and (the first to seventh) "checking results used for explaining FIG. 6 are merely for conveniently describing the specification and claims, and do not intend to be in specific orders.

Figure 7:
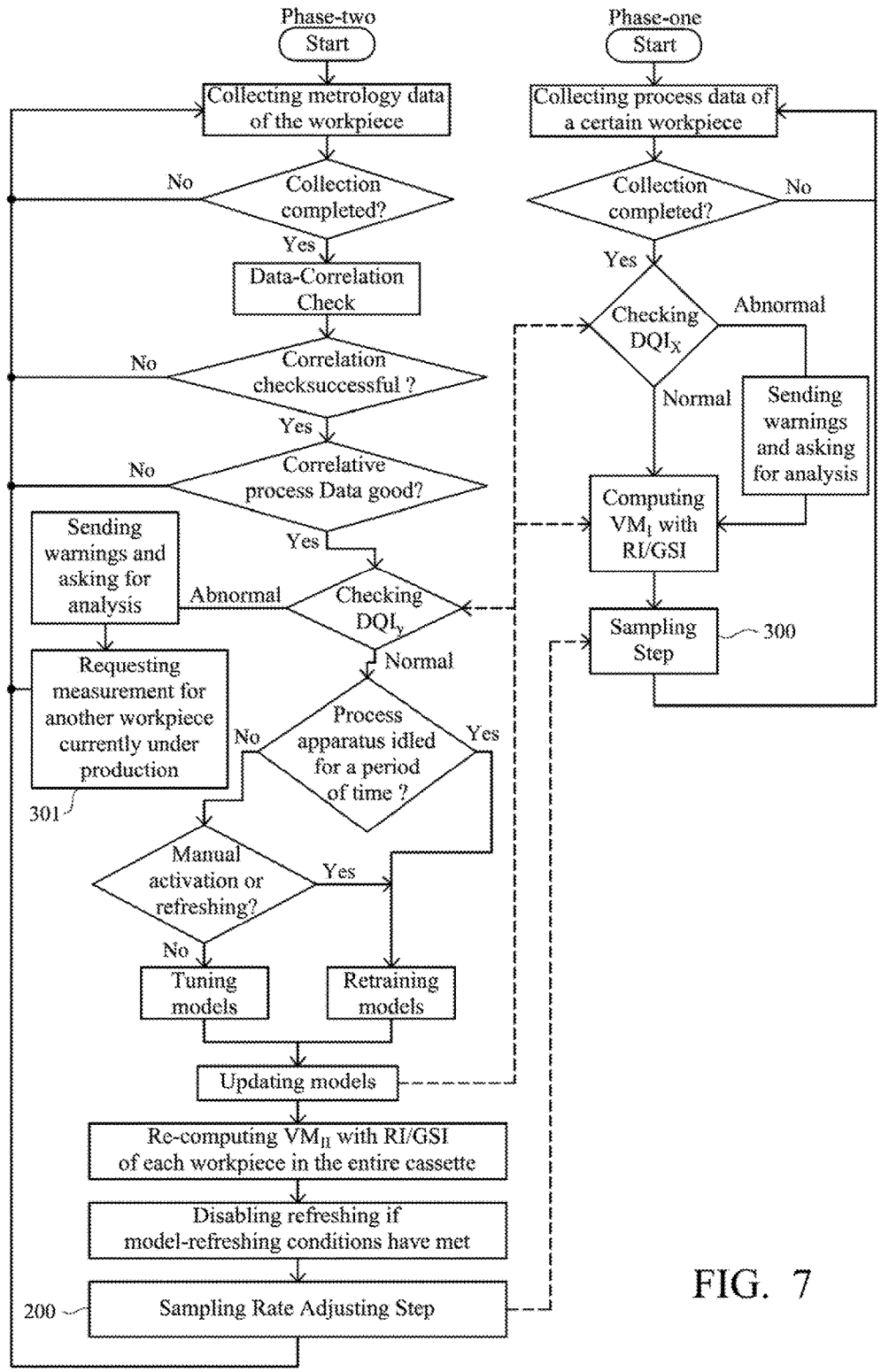
FIG. 7 is a schematic flow chart showing a virtual metrology method according various embodiments of the present invention.

Besides, after the actual metrology is performed on the workpiece, metrology, the workpiece sampling step 150 is also directed to evaluation of a $DQI_y$ value of a workpiece, as shown in step 301 of FIG. 7. At first, an actual measurement value of the workpiece and a set of process data corresponding to the actual measurement value are collected. The set of process data is converted to a set of z scores. The set of z scores and the actual measurement value are inputted into the $DQI_y$ model, thereby computing a $DQI_y$ value of the actual measurement value of the workpiece. When the $DQI_y$ value of the workpiece is greater than the $DQI_y$ threshold, it represents that the actual measurement value is abnormal and cannot be used for tuning or changing models. For making up such insufficiency, another workpiece which is currently under production has to be requested for measurement (i.e. the workpiece count is set to N).

It is understood that the metrology sampling method of the present invention are performed by the aforementioned steps. A computer program of the present invention stored on a non-transitory tangible computer readable recording medium is used to perform the metrology sampling method described above. The aforementioned embodiments can be provided as a computer program product, which may include a machine-readable medium on which instructions are stored for programming a computer (or other electronic devices) to perform a process based on the embodiments of the present invention. The machine-readable medium can be, but is not limited to, a floppy diskette, an optical disk, a compact disk-read-only memory (CD-ROM), a magneto-optical disk, a read-only memory (ROM), a random access memory (RAM), an erasable programmable read-only memory (EPROM), an electrically erasable programmable read-only memory (EEPROM), a magnetic or optical card, a flash memory, or another type of media/machine-readable medium suitable for storing electronic instructions. Moreover, the embodiments of the present invention also can be downloaded as a computer program product, which may be transferred from a remote computer to a requesting computer by using data signals via a communication link (such as a network connection or the like).

It is also noted that the present invention also can be described in the context of a manufacturing system. Although the present invention may be implemented in semiconductor fabrication, the present invention is not limited to implementation in semiconductor fabrication and may be applied to other manufacturing industries, in which the manufacturing system is configured to fabricate workpieces or products including, but not limited to, microprocessors, memory devices, digital signal processors, application specific integrated circuits (ASICs), or other similar devices. The present invention may also be applied to workpieces or manufactured products other than semiconductor devices, such as vehicle wheels, screws. The manufacturing system includes one or more processing tools that may be used to form one or more products, or portions thereof, in or on the workpieces (such as wafers). In the illustrated embodiment, the processing tools are depicted as a single entity. However, persons of ordinary skill in the art should appreciate that the processing tools may be implemented in any number of entities of any type, including lithography tools, deposition tools, etching tools, polishing tools, annealing tools, machine tools, and the like. In the embodiments, the manufacturing system also includes one or more metrology tools, such as scatterometers, ellipsometers, scanning electron microscopes, and the like.

The manufacturing system includes a sample selection unit communicatively coupled to the processing tools and the metrology tools for performing a metrology sampling method with a sampling rate decision scheme according to embodiments of the present invention. Persons of ordinary skill in the art are able to configure the manufacturing system to provide the required interconnections to establish a communicative coupling between the sample selection unit, the processing tools, and the metrology tools. In various alternative embodiments, the sample selection unit may be implemented in a computing device such as a desktop computer, a laptop computer, and the like. However, persons of ordinary skill in the art should appreciate that, in alternative embodiments, portions of the sample selection unit may be implemented in any number of devices and/or locations.

On the other hand, a metrology sampling method according to the embodiments of the present invention also can be combined with a method for automatic virtual metrology (AVM) disclosed by U.S. Pat. No. 8,095,484 B2. Referring to FIG. 7, FIG. 7 is a schematic flow chart showing a virtual metrology method according various embodiments of the present invention. After all of the steps in a phase-one virtual metrology are completed, the sampling step 300 as shown in FIG. 6 is performed to determine if a workpiece needs actual measurement. After all of the steps in a phase-two virtual metrology have been performed, the sampling rate adjusting step 200 shown in FIG. 5A and FIG. 5B is performed to adjust the value of N for use in step 300. In the phase-two virtual metrology, when an actual measurement value of a certain workpiece is obtained, the $DQI_y$ value of the workpiece is checked. When the $DQI_y$ value of the workpiece is greater than the $DQI_y$ threshold, step 301 is performed to request measurement for another workpiece which is currently under production (i.e. set the workpiece count to N). After the metrology sampling method according to the embodiments of the present invention are combined with the virtual metrology method, an actual measurement value of a workpiece can be obtained in time for tuning or retraining the VM models, thereby assuring the VM accuracy.

It can be known from the aforementioned embodiments that, by using the ASD scheme constructed by various index values representing status changes or abnormal information of a process tool during a production process, the present invention can effectively adjust the workpiece sampling rate, assure the VM accuracy and greatly lower the workpiece sampling rate.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A metrology sampling method, comprising:
collecting a plurality of sets of historical process data used by a process tool for processing a plurality of historical workpieces, and a plurality of historical measurement values of the historical workpieces corresponding to the sets of historical process data;
performing a model-creation step, comprising:
building a conjecture model in accordance with a conjecture algorithm by using the sets of historical process data and the historical measurement values;
initializing a workpiece sampling rate represented by 1/N, wherein the workpiece sampling rate is directed to selecting the $N^{th}$ workpiece in each N workpieces processed by a process tool as a workpiece expected to be measured;
adding a workpiece to a set of determinative samples;
collecting a set of process data which is used by the process tool to process the workpiece;
inputting the set of process data of the workpiece into the conjecture model, thereby computing a virtual metrology value of the workpiece;
computing an absolute percentage error of the virtual metrology value of the workpiece;
determining if the absolute percentage error of the virtual metrology value is greater than a specification of virtual metrology maximum error defined for the process tool, thereby obtaining a first result;
increasing an OOS (Out of Spec) count by 1 when the first result is true;
when the first result is false, computing a mean absolute percentage error (MAPE) of virtual metrology values of all workpieces in the set of determinative samples, and determining if the mean absolute percentage error is greater than or equal to an upper control limit of MAPE, thereby obtaining a second result;
when the second result is true, increasing the workpiece sampling rate by decreasing N, clearing the set of determinative samples, and setting the OOS count to 0;
when the second result is false, determining if the number of workpieces in the set of determinative samples is greater than or equal to a threshold of the number of determinative samples, thereby obtaining a third result;
when the third result is false, retaining the workpiece sampling rate unchanged;
when the third result is true, computing a maximum absolute percentage error (MaxErr) of virtual metrology values of all workpieces in the set of determinative samples, and determining if the maximum absolute percentage error is smaller than an upper control limit of MaxErr, thereby obtaining a fourth result;
when the fourth result is true, decreasing the workpiece sampling rate by increasing N, clearing the set of determinative samples, and setting the OOS count to 0; and
when the fourth result is false, discarding an oldest workpiece in the set of determinative samples, and retaining the workpiece sampling rate unchanged.

2. The metrology sampling method of claim 1, wherein the upper control limit of MaxErr is a first conservative factor multiplied by $SPEC_{Max}$, and the upper control limit of MAPE is a second conservative factor multiplied by $SPEC_{Max}$, and the first conservative factor and the second conservative factor are greater than 0 and smaller than or equal to 1, and the first conservative factor is greater than the second conservative factor.

3. The metrology sampling method of claim 1, wherein, when the first result is true, the metrology sampling method further comprises:
determining if the OOS count is greater than or equal to a OOS threshold, thereby obtaining a fifth result; and
when the fifth result is true, increasing the workpiece sampling rate by decreasing N, clearing the set of determinative samples, and setting the OOS count to 0.

4. The metrology sampling method of claim 3, wherein the OOS threshold is 2.

5. The metrology sampling method of claim 1, further comprising:
obtaining a minimum workpiece sampling rate represented by $1/N_{max}$ and a default workpiece sampling rate represented by $1/N_{default}$, wherein $N_{max}$ is a maximum value of N, and $N_{default}$ is a default value of N;
multiplying a third conservative factor by $N_{max}$, thereby obtaining a test value, wherein the third conservative factor is greater than 0 and smaller than or equal to 1;
determining if the test value is greater than $N_{default}$, thereby obtaining a sixth result; and
when the sixth result is true, setting $N_{default}$ equal to the test value.

6. The metrology sampling method of claim 5, further comprising:
performing a first checking step to check if a status change of the process tool occurs, thereby obtaining a first checking result;
When the first checking result is true, clearing the set of determinative samples, setting the OOS count to 0, and performing a second checking step to check if N is greater than $N_{default}$, thereby obtaining a second checking result; and
when the second checking result is true, setting N to $N_{default}$.

7. The metrology sampling method of claim 6, further comprising:
performing the model-creation step, further comprising:
building a $DQI_X$ (Process Data Quality Index) model and a GSI (Global Similarity Index) model and computing a $DQI_X$ threshold and a GSI threshold by using the sets of historical process data; and
performing a metrology workpiece sampling step, comprising:
inputting the set of process data of the workpiece into the $DQI_X$ model and the GSI model, thereby obtaining a $DQI_X$ value and a GSI value of the set of process data of the workpiece;
increasing a workpiece count by 1;
when the first checking result is true, performing a third checking step to check if the $DQI_X$ value is smaller than or equal to the $DQI_X$ threshold, thereby obtaining a third checking result;
when the third checking result is false, skipping an measurement of the workpiece;
when the third checking result is true, performing a fourth checking step to check if the workpiece count is greater than or equal to N, thereby obtaining a fourth checking result;
when the fourth checking result is true, performing metrology on the workpiece and setting the workpiece count to 0;
when the fourth checking result is false, performing a fifth checking step to check if the GSI value of the workpiece is smaller than or equal to the GSI threshold, thereby obtaining a fifth checking result; and
when the fifth checking result is true, skipping the measurement of the workpiece.

8. The metrology sampling method of claim 7, further comprising:
building a reference model in accordance with a reference prediction algorithm by using the sets of historical process data and the historical measurement values, wherein the conjecture algorithm is different from the reference prediction algorithm;
computing a RI (Reliance Index) threshold based on a maximal tolerable error limit defined by errors of virtual metrology values obtained from the conjecture model;
inputting the set of process data of the workpiece into the reference model, thereby computing a reference prediction value of the workpiece;
calculating an overlap area between the statistical distribution of the virtual metrology value of the workpiece and the statistical distribution of the reference prediction value of the workpiece, thereby generating a RI value of the workpiece;
when the fourth checking result is false, performing a sixth checking step to check if the RI value of the workpiece is greater than or equal to the RI threshold, thereby obtaining a sixth checking result; and
when the sixth checking result is true, skipping the measurement of the workpiece.

9. The metrology sampling method of claim 8, further comprising:
performing metrology on the workpiece and setting the workpiece count to 0, when the fifth checking result or the sixth checking result is false, and the GSI values of k workpieces processed before the workpiece all are greater than the GSI threshold or the RI values of k workpieces processed before the workpiece all are smaller than the RI threshold, wherein k is a positive integer.

10. The metrology sampling method of claim 7, further comprising:
before an operation of increasing the workpiece count by 1 is performed, a seventh checking step is performed to check if the process tool has been idle for a period of time, thereby obtaining a seventh checking result; and
performing metrology on the workpiece and setting the workpiece count to 0, when the seventh checking result is true.

11. A computer program product stored on a non-transitory tangible computer readable recording medium, which, when executed, performs a metrology sampling method, the metrology sampling method, comprising:
collecting a plurality of sets of historical process data used by a process tool for processing a plurality of historical workpieces, and a plurality of historical measurement values of the historical workpieces corresponding to the sets of historical process data;
performing a model-creation step, comprising:
building a conjecture model in accordance with a conjecture algorithm by using the sets of historical process data and the historical measurement values;
initializing a workpiece sampling rate represented by 1/N, wherein the workpiece sampling rate is directed to selecting the $N^{th}$ workpiece in each N workpieces processed by a process tool as a workpiece expected to be measured;
adding a workpiece to a set of determinative samples;
collecting a set of process data which is used by the process tool to process the workpiece;
inputting the set of process data of the workpiece into the conjecture model, thereby computing a virtual metrology value of the workpiece;
computing an absolute percentage error of the virtual metrology value of the workpiece;
determining if the absolute percentage error of the virtual metrology value is greater than a specification of virtual metrology maximum error defined for the process tool, thereby obtaining a first result;
increasing an OOS (Out of Spec) count by 1 when the first result is true;
when the first result is false, computing a mean absolute percentage error (MAPE) of virtual metrology values of all workpieces in the set of determinative samples, and determining if the mean absolute percentage error is greater than or equal to an upper control limit of MAPE, thereby obtaining a second result;
when the second result is true, increasing the workpiece sampling rate by decreasing N, clearing the set of determinative samples, and setting the OOS count to 0;
when the second result is false, determining if the number of workpieces in the set of determinative samples is greater than or equal to a threshold of the number of determinative samples, thereby obtaining a third result;

when the third result is false, retaining the workpiece sampling rate unchanged;

when the third result is true, computing a maximum absolute percentage error (MaxErr) of virtual metrology values of all workpieces in the set of determinative samples, and determining if the maximum absolute percentage error is smaller than an upper control limit of MaxErr, thereby obtaining a fourth result;

when the fourth result is true, decreasing the workpiece sampling rate by increasing N, clearing the set of determinative samples, and setting the OOS count to 0; and when the fourth result is false, discarding an oldest workpiece in the set of determinative samples, and retaining the workpiece sampling rate unchanged.

12. The computer program product of claim 11, wherein the upper control limit of MaxErr is a first conservative factor multiplied by $SPEC_{Max}$, and the upper control limit of MAPE is a second conservative factor multiplied by $SPEC_{Max}$, and the first conservative factor and the second conservative factor are greater than 0 and smaller than or equal to 1, and the first conservative factor is greater than the second conservative factor.

13. The computer program product of claim 11, wherein, when the first result is true, the metrology sampling method further comprises:

determining if the OOS count is greater than or equal to a OOS threshold, thereby obtaining a fifth result; and when the fifth result is true, increasing the workpiece sampling rate by decreasing N, clearing the set of determinative samples, and setting the OOS count to 0.

14. The computer program product of claim 13, wherein the OOS threshold is 2.

15. The computer program product of claim 11, the metrology sampling method further comprising:

obtaining a minimum workpiece sampling rate represented by $1/N_{max}$ and a default workpiece sampling rate represented by $1/N_{default}$, wherein $N_{max}$ is a maximum value of N, and $N_{default}$ is a default value of N;

multiplying a third conservative factor by $N_{max}$, thereby obtaining a test value, wherein the third conservative factor is greater than 0 and smaller than or equal to 1;

determining if the test value is greater than $N_{default}$, thereby obtaining a sixth result; and when the sixth result is true, setting $N_{default}$ equal to the test value.

16. The computer program product of claim 15, the metrology sampling method further comprising:

performing a first checking step to check if a status change of the process tool occurs, thereby obtaining a first checking result;

When the first checking result is true, clearing the set of determinative samples, setting the OOS count to 0, and performing a second checking step to check if N is greater than $N_{default}$, thereby obtaining a second checking result; and when the second checking result is true, setting N to $N_{default}$.

17. The computer program product of claim 16, the metrology sampling method further comprising:

performing the model-creation step, further comprising:
building a $DQI_X$ (Process Data Quality Index) model and a GSI (Global Similarity Index) model and computing a $DQI_X$ threshold and a GSI threshold by using the sets of historical process data; and performing a metrology workpiece sampling step, comprising:
inputting the set of process data of the workpiece into the $DQI_X$ model and the GSI model, thereby obtaining a $DQI_X$ value and a GSI value of the set of process data of the workpiece;

increasing a workpiece count by 1;

when the first checking result is true, performing a third checking step to check if the $DQI_X$ value is smaller than or equal to the $DQI_X$ threshold, thereby obtaining a third checking result;

when the third checking result is false, skipping an measurement of the workpiece;

when the third checking result is true, performing a fourth checking step to check if the workpiece count is greater than or equal to N, thereby obtaining a fourth checking result;

when the fourth checking result is true, performing metrology on the workpiece and setting the workpiece count to 0;

when the fourth checking result is false, performing a fifth checking step to check if the GSI value of the workpiece is smaller than or equal to the GSI threshold, thereby obtaining a fifth checking result; and when the fifth checking result is true, skipping the measurement of the workpiece.

18. The computer program product of claim 17, the metrology sampling method further comprising:

building a reference model in accordance with a reference prediction algorithm by using the sets of historical process data and the historical measurement values, wherein the conjecture algorithm is different from the reference prediction algorithm;

computing a RI (Reliance Index) threshold based on a maximal tolerable error limit defined by errors of virtual metrology values obtained from the conjecture model;

inputting the set of process data of the workpiece into the reference model, thereby computing a reference prediction value of the workpiece;

calculating an overlap area between the statistical distribution of the virtual metrology value of the workpiece and the statistical distribution of the reference prediction value of the workpiece, thereby generating a RI value of the workpiece;

when the fourth checking result is false, performing a sixth checking step to check if the RI value of the workpiece is greater than or equal to the RI threshold, thereby obtaining a sixth checking result; and when the sixth checking result is true, skipping the measurement of the workpiece.

19. The computer program product of claim 18, the metrology sampling method further comprising:

performing metrology on the workpiece and setting the workpiece count to 0, when the fifth checking result or the sixth checking result is false, and the GSI values of k workpieces processed before the workpiece all are greater than the GSI threshold or the RI values of k workpieces processed before the workpiece all are smaller than the RI threshold, wherein k is a positive integer.

20. The computer program product of claim 17, the metrology sampling method further comprising:

before an operation of increasing the workpiece count by 1 is performed, a seventh checking step is performed to check if the process tool has been idle for a period of time, thereby obtaining a seventh checking result; and performing metrology on the workpiece and setting the workpiece count to 0, when the seventh checking result is true.

* * * * *